US010854492B2

(12) United States Patent
Bosch et al.

(10) Patent No.: US 10,854,492 B2
(45) Date of Patent: Dec. 1, 2020

(54) EDGE RING ASSEMBLY FOR IMPROVING FEATURE PROFILE TILTING AT EXTREME EDGE OF WAFER

(71) Applicant: Lam Research Corporation, Fremont, CA (US)

(72) Inventors: William Frederick Bosch, Fremont, CA (US); Rajesh Dorai, Fremont, CA (US); Tamarak Pandhumsoporn, Fremont, CA (US); Brett C. Richardson, San Ramon, CA (US); James C. Vetter, Pine Grove, CA (US); Patrick Chung, Tracy, CA (US)

(73) Assignee: Lam Research Corporation, Fremont, CA (US)

( * ) Notice: Subject to any disclaimer, the term of this patent is extended or adjusted under 35 U.S.C. 154(b) by 981 days.

(21) Appl. No.: 15/205,253

(22) Filed: Jul. 8, 2016

(65) Prior Publication Data

US 2017/0053820 A1 Feb. 23, 2017

Related U.S. Application Data

(60) Provisional application No. 62/206,753, filed on Aug. 18, 2015.

(51) Int. Cl.
*H01L 21/683* (2006.01)
*H01J 37/32* (2006.01)

(52) U.S. Cl.
CPC .... *H01L 21/6833* (2013.01); *H01J 37/32082* (2013.01); *H01J 37/32091* (2013.01);
(Continued)

(58) Field of Classification Search
CPC ......... C30B 25/00; C30B 25/02; C30B 25/12; C30B 25/16; C23C 16/44; C23C 16/458;
(Continued)

(56) References Cited

U.S. PATENT DOCUMENTS

| 6,464,794 B1* | 10/2002 | Park | C23C 16/4583 |
| | | | 118/724 |
| 2002/0022281 A1* | 2/2002 | Flanner | H01L 21/31138 |
| | | | 438/8 |
| 2004/0053428 A1* | 3/2004 | Steger | H01J 37/32623 |
| | | | 438/10 |

(Continued)

FOREIGN PATENT DOCUMENTS

| CN | 1373899 A | 10/2002 |
| CN | 1682344 A | 10/2005 |

(Continued)

OTHER PUBLICATIONS

European Search Report and Written Opinion issued in European Application No. EP 16 18 3167, dated Dec. 13, 2016 (7 total pages).

*Primary Examiner* — Kenneth A Bratland, Jr.
(74) *Attorney, Agent, or Firm* — Penilla IP, APC

(57) ABSTRACT

An edge ring assembly is provided, including: an upper edge ring configured to surround an electrostatic chuck (ESC), the ESC having a top surface for supporting a substrate and an annular step surrounding the top surface, the annular step defining an annular shelf that is lower than the top surface, the upper edge ring being disposed above the annular shelf; a lower inner edge ring disposed below the upper edge ring in the annular step and disposed over the annular shelf, the lower inner edge ring being defined from an electrically conductive material, the lower inner edge ring being electrically insulated from the ESC; a lower outer edge ring surrounding the inner edge ring, the lower outer edge ring being disposed below the upper edge ring in the annular step and disposed over the annular shelf, the lower outer edge ring being defined from an electrically insulating material.

18 Claims, 18 Drawing Sheets

(52) U.S. Cl.
CPC .. *H01J 37/32174* (2013.01); *H01J 37/32532* (2013.01); *H01J 37/32623* (2013.01); *H01J 37/32642* (2013.01); *H01J 2237/334* (2013.01)

(58) Field of Classification Search
CPC ............ C23C 16/4585; C23C 16/4581; C23C 16/4582; C23C 16/4583; H01J 37/32082; H01J 37/32091; H01J 37/32174; H01J 37/32532; H01J 37/32623; H01J 37/32642; H01J 2237/334; H01L 21/6833; H01L 21/67; H01L 21/683
USPC ..... 117/200–202, 204; 118/715, 722, 723 R, 118/723 E, 723 I, 728; 156/345.1, 156/345.39, 345.43, 345.44, 345.48, 156/345.51
See application file for complete search history.

(56) References Cited

U.S. PATENT DOCUMENTS

| | | | | |
|---|---|---|---|---|
| 2005/0061447 | A1* | 3/2005 | Kim | H01J 37/32623 156/345.51 |
| 2005/0103442 | A1* | 5/2005 | Chen | H01J 37/32082 156/345.47 |
| 2008/0289766 | A1 | 11/2008 | Heemstra et al. | |
| 2014/0011365 | A1* | 1/2014 | Yasui | H01L 21/3065 438/712 |
| 2014/0020708 | A1* | 1/2014 | Kim | B08B 7/0035 134/1.1 |

FOREIGN PATENT DOCUMENTS

| | | |
|---|---|---|
| EP | 1898444 A1 | 3/2008 |
| EP | 1540695 B1 | 3/2010 |

* cited by examiner

► Run#1 SEMs: Noel 16% EA, Standard Edge HW vs HAA Yttria edge H/W
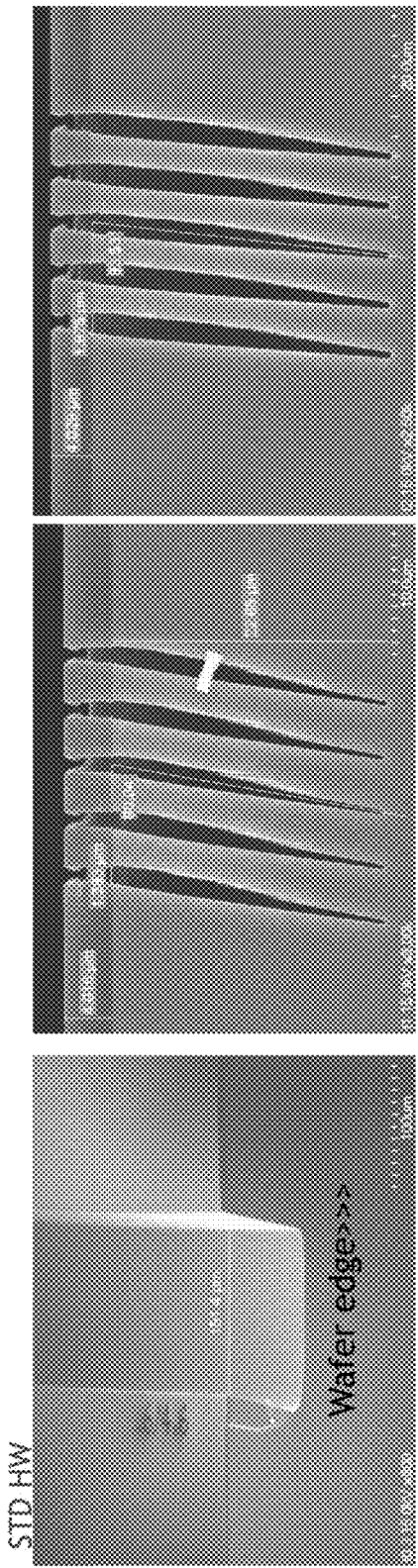
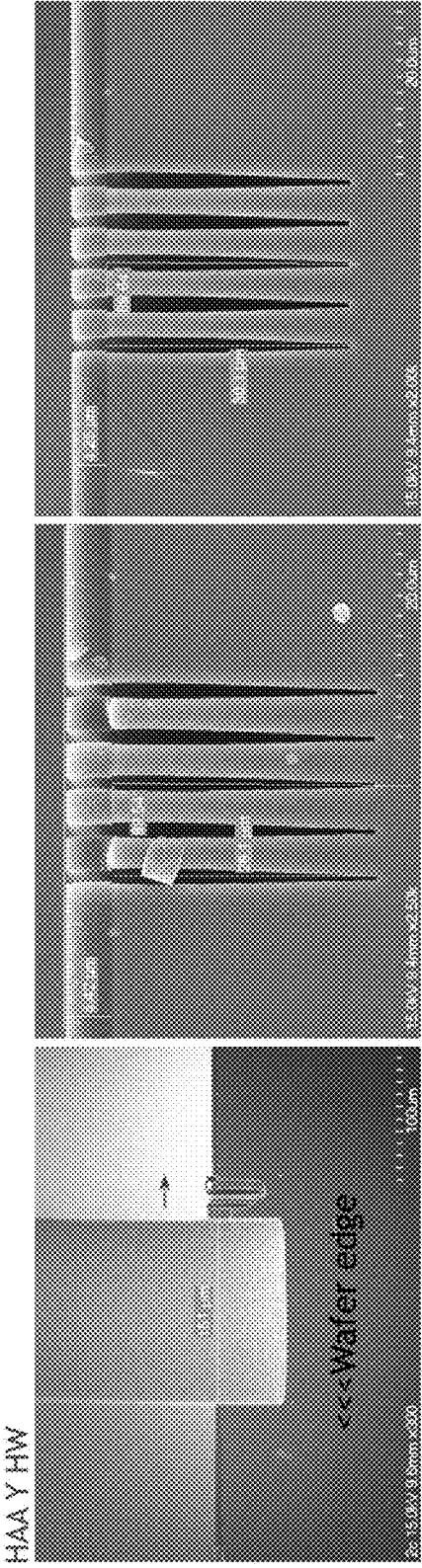
FIG. 13A — 150um Trench, 1st trench from edge, ~0.5 EE (STD HW)
FIG. 13B — 0.6um Tr/6.0um Sp, ~0.7mm EE, Tilt ~ -9.96°
FIG. 13C — 1.0um Tr/6.0um Sp, ~1.2mm EE, Tilt ~ -6.47°
FIG. 13D — 150um Trench, 1st trench from edge, ~0.5 EE (HAA Y HW)
FIG. 13E — 0.6um Tr/6.0um Sp, ~0.7mm EE, Tilt ~ -0.46°
FIG. 13F — 1.0um Tr/6.0um Sp, ~1.2mm EE, Tilt ~ -0.36°

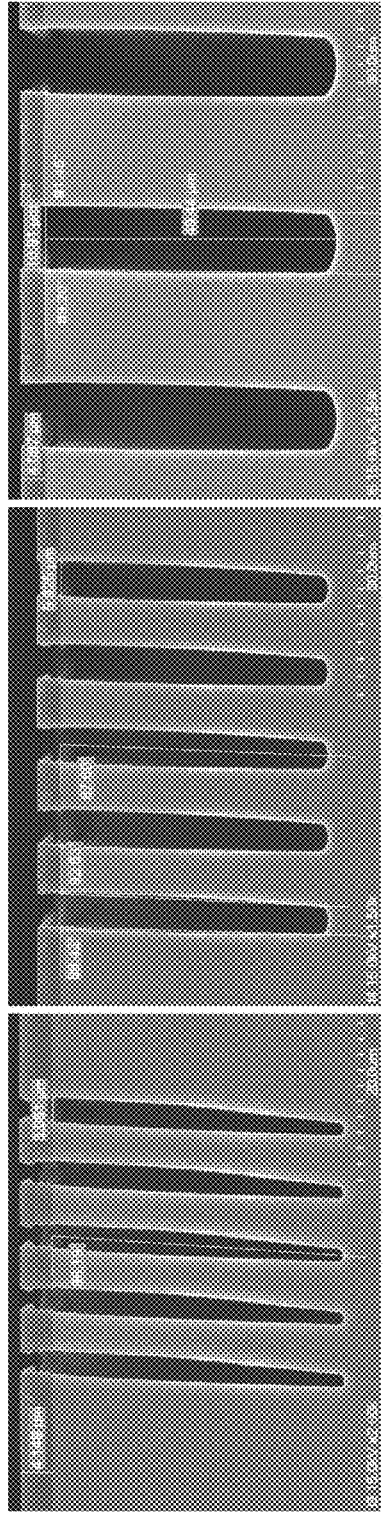
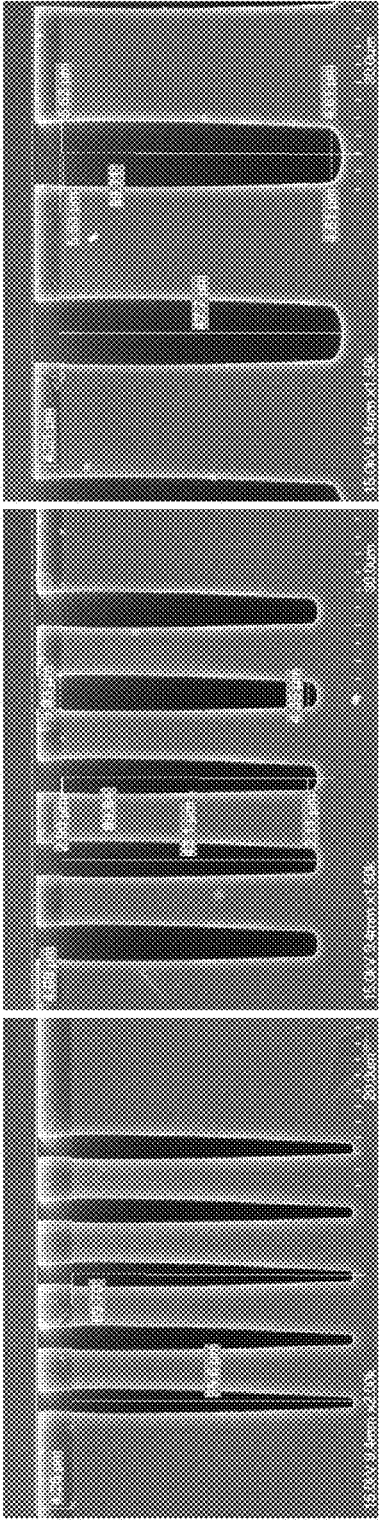
Run#1 SEMs: Noel 16% EA, Standard Edge HW vs HAA Yttria edge H/W

EDGE RING ASSEMBLY FOR IMPROVING FEATURE PROFILE TILTING AT EXTREME EDGE OF WAFER

CLAIM OF PRIORITY

This application claims priority to U.S. Provisional Application No. 62/206,753, filed Aug. 18, 2015, entitled "Edge Ring Assembly for Improving Feature Profile Tilting at Extreme Edge of Wafer," the disclosure of which is incorporated by reference herein.

BACKGROUND

Field of the Invention

The present embodiments relate to semiconductor wafer processing equipment tools, and more particularly, edge ring assemblies used in plasma process chambers.

Description of the Related Art

When a plasma etch process is carried out on a wafer, the plasma sheath tends to bend around the bevel edge of the wafer. Because of this effect, at the extreme edge of the wafer, the etched features profiles tilt towards the edge of the wafer. This tilting can be catastrophic for devices, and may effectively render the extreme edge region of the wafer unusable. By way of example, 3D NAND structures may miss underlying contacts due to feature profile tilting. MEMS devices can be especially susceptible to feature tilt, as even a 0.1-0.2 degree tilting of features may render a MEMS gyroscope inoperable, by way of example. Under current technology, MEMS devices such as silicon gyroscopes are manufactured through plasma etch processes. One example of a plasma etch chamber that is suitable for the manufacture of MEMS devices is the TCP® 9400DSiE™ (Deep Silicon Etch) manufactured by Lam Research Corporation. Feature profile tilting causes quadrature error in Si gyroscopes which are fabricated at the edge region of the substrate, and therefore decreases yield. As the area gained per unit of radial distance is greatest at the edge of the wafer, even incremental gains in usable radius can significantly improve yield.

It is in this context that embodiments of the inventions arise.

SUMMARY

Implementations of the disclosure provide for an edge ring assembly that is configured to reduce feature profile tilting at the extreme wafer edge region. By reducing feature profile tilting at the edge region, more usable area of the wafer becomes available with consequent improvements in yield of fabricated devices, e.g. MEMS Si gyroscopes. In implementations of the disclosure, a passively powered edge ring electrode is provided that exhibits a capacitive coupling to the electrostatic chuck (ESC) when RF power is applied to the ESC (as a bottom electrode). The passive powering of the edge ring does not require the additional expense or added complexity of a separate RF power supply, yet still provides for improvement in the profile tilt of features etched at the wafer edge.

Embodiments of the present disclosure provide methods, apparatus, and systems to enable and gain control over the plasma sheath boundary at the extreme wafer edge to facilitate edge-localized ion trajectory control and thereby provide for tuning of the wafer profile at the extreme wafer edge typically encompassing the radially outermost 5 to 15 mm (e.g. ranging from approximately 60-75 mm along a radius for a 150 mm wafer, 85-100 mm along a radius for a 200 mm wafer, 135-150 mm along a radius for a 300 mm wafer, etc. and beyond (with edge exclusion ranging from about 1-5 mm)). Achieving control over ion trajectory and minimizing the resulting ion focusing effects caused due to sheath bending near the wafer edge can not only manipulate the ion trajectories to the wafer but also the ion to neutral flux ratio.

The plasma sheath boundary in the vicinity of the extreme wafer edge can be modified by enabling a sheath continuity over the edge ring assembly. The presence of the modified sheath boundary due to the passively powered edge ring electrode reduces ion tilting and ion focusing at the wafer edge.

In one implementation, an edge ring assembly for a plasma processing chamber is provided, comprising: an upper edge ring configured to surround an electrostatic chuck (ESC) that is configured for electrical connection to an RF power supply, the ESC having a top surface for supporting a substrate and an annular step surrounding the top surface, the annular step defining an annular shelf that is lower than the top surface, the upper edge ring being disposed above the annular shelf, the upper edge ring being defined from an electrically insulating material; a lower inner edge ring disposed below the upper edge ring in the annular step and disposed over the annular shelf, the lower inner edge ring being defined from an electrically conductive material, the lower inner edge ring being electrically insulated from the ESC; a lower outer edge ring surrounding the inner edge ring, the lower outer edge ring being disposed below the upper edge ring in the annular step and disposed over the annular shelf, the lower outer edge ring being defined from an electrically insulating material.

In one implementation, a dielectric separation between the lower inner edge ring and the ESC is configured to provide for a predefined capacitance, wherein power transferred to the ESC from the RF power supply is transferred to the lower inner edge ring in a predefined relative amount as determined by the predefined capacitance.

In one implementation, the upper edge ring is defined from a quartz material.

In one implementation, the lower outer edge ring is defined from a quartz material.

In one implementation, the lower inner edge ring is defined from an aluminum material.

In one implementation, the lower inner edge ring has an anodized aluminum surface that provides for the electrical insulation from the ESC.

In one implementation, the lower inner edge ring and the lower outer edge ring are disposed directly over the annular shelf of the ESC.

In one implementation, application of RF power from the RF power supply to the ESC during plasma processing provides for a capacitive coupling of the lower inner edge ring to the ESC.

In one implementation, the capacitive coupling during plasma processing causes a plasma sheath that is defined during the plasma processing to be radially extended in a spatial region that is defined substantially over the upper edge ring.

In one implementation, the capacitive coupling during plasma processing reduces ion focusing at an edge region of the substrate.

In one implementation, the capacitive coupling during plasma processing reduces tilting of ion trajectories at the edge region of the substrate away from normal to a top surface of the substrate.

In one implementation, the upper edge ring is annularly shaped, extending between inner and outer diameters in the range of about 190 mm to 230 mm, and having a radial thickness/width of about 15 to 25 mm, and a height of about 2 mm to 5 mm.

In one implementation, the lower inner edge ring is annularly shaped, extending between inner and outer diameters in the range of about 190 mm to 225 mm, and having a radial thickness/width of about 15 to 20 mm, and a height of about 8 to 15 mm.

In one implementation, an inner diameter of the lower inner edge ring is about 0.5 to 1 mm greater than a diameter of a sidewall defined by the annular step of the ESC, so as to define an annular gap between the sidewall and the lower inner edge ring.

In one implementation, the lower outer edge ring is annularly shaped, extending between inner and outer diameters in the range of about 220 mm to 245 mm, and having a radial thickness/width of about 10 to 15 mm, and a height of about 8 mm to 15 mm.

In one implementation, the upper edge ring has a top surface, the top surface of the upper edge ring having a stepped edge defined at an inner diameter of the upper edge ring, wherein a lower portion of the stepped edge is configured to sit at a lower height than the top surface of the ESC, such that the substrate when present extends over the lower portion of the stepped edge.

In one implementation, the lower inner edge ring includes a yttria outer coating.

In one implementation, a system for plasma processing is provided, comprising: a process chamber; an electrostatic chuck (ESC) disposed in the process chamber, the ESC having a top surface that is configured to support a substrate during plasma processing, the ESC further including an annular step surrounding the top surface, the annular step defining an annular shelf at a lower height than the top surface; an upper edge ring disposed above the annular shelf, the upper edge ring being defined from an electrically insulating material; a lower inner edge ring disposed below the upper edge ring in the annular step and disposed over the annular shelf, the lower inner edge ring being defined from an electrically conductive material, the lower inner edge ring being electrically insulated from the ESC; a lower outer edge ring surrounding the inner edge ring, the lower outer edge ring disposed below the upper edge ring in the annular step and disposed over the annular shelf, the lower outer edge ring being defined from an electrically insulating material; a bias electrode disposed within the ESC, the bias electrode configured to receive RF power from a first RF power supply to generate a bias voltage on the substrate.

BRIEF DESCRIPTION OF THE DRAWINGS

FIGS. 13A, 13B, and 13C are SEM images showing cross sections of features which are approximately 0.5 mm, 0.7 mm, and 1.2 mm from the wafer edge, respectively, which have been processed using the standard setup. FIGS. 13D, 13E, and 13F are corresponding SEM images showing cross sections of features which are approximately 0.5 mm, 0.7 mm, and 1.2 mm from the wafer edge, respectively, which have been processed using the setup employing the yttria coated HAA electrode ring.

FIGS. 14A, 14B, and 14C are SEM images showing cross sections of features which are approximately 1.7 mm, 2.2 mm, and 2.7 mm from the wafer edge, respectively, which have been processed using the standard setup. FIGS. 14D, 14E, and 14F are corresponding SEM images showing cross sections of features which are approximately 1.7 mm, 2.2 mm, and 2.7 mm from the wafer edge, respectively, which have been processed using the setup employing the yttria coated HAA electrode ring.

DESCRIPTION

Embodiments of the disclosure provide methods, apparatus, and systems for enabling extreme edge sheath and wafer profile tuning through edge-localized ion trajectory control and plasma operation. It should be appreciated that the present embodiments can be implemented in numerous ways, such as a process, an apparatus, a system, a device, a material, or a method. Several embodiments are described below.

In some implementations, extreme wafer edge control of ion flux and trajectories is achieved through a passively powered edge ring assembly wherein a capacitively coupled edge ring electrode is included in the edge ring assembly surrounding the electrostatic chuck (ESC) ceramic.

Through capacitive coupling of the edge ring electrode to the ESC, the plasma sheath boundary in the vicinity of the extreme wafer edge can be modified by enabling a sheath continuity over the edge ring assembly. The presence of the modified sheath boundary due to the passively powered edge ring electrode reduces ion tilting and ion focusing at the wafer edge.

The passively powered edge ring assembly is disposed in an area around the main chuck so that the plasma at and near the wafer edge can be influenced. The influence on the plasma can assist to provide uniformity and continuity of a plasma sheath in areas near the edge exclusion and out to the physical edge of the wafer. An advantage of providing uniformity up to and including the exclusion is that more usable devices can be defined per wafer, which increases fabrication yield.

Figure 1A:
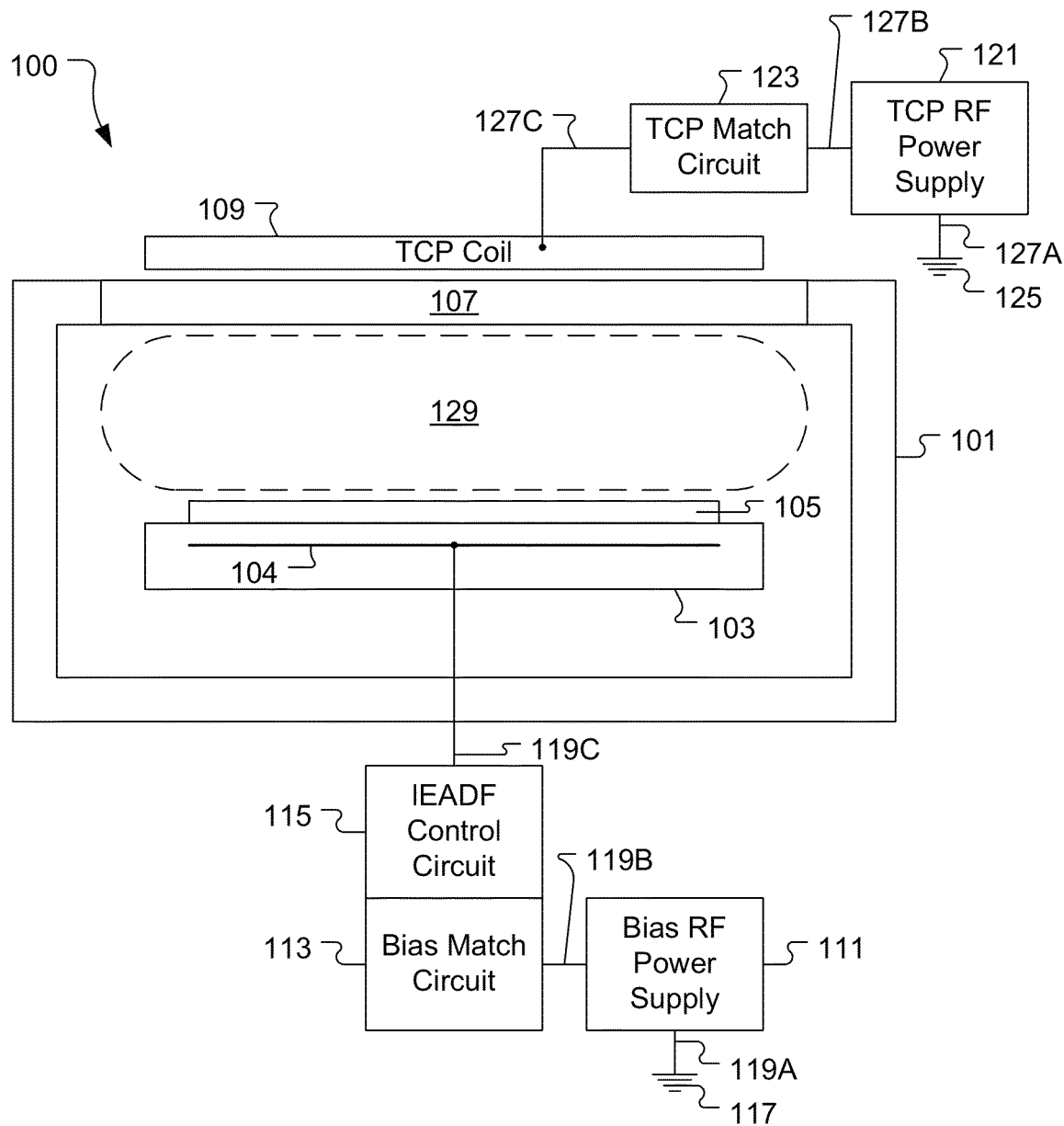
FIG. 1A shows an architectural view of a plasma processing system 100 for etching operations, in accordance with one embodiment of the present invention.
Figure 1B:
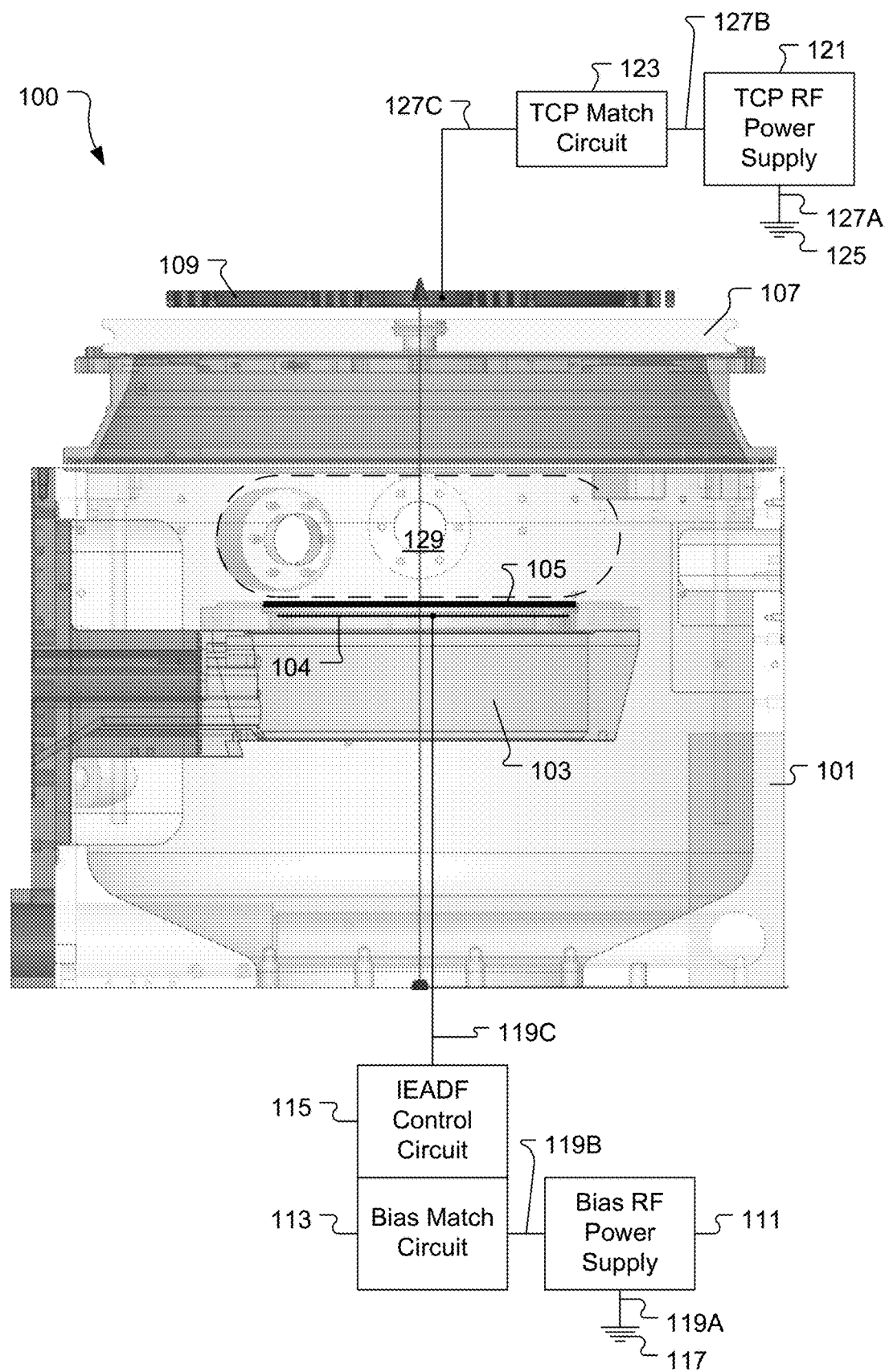
FIG. 1B shows a design view of the plasma processing system 100, in accordance with one embodiment of the present invention.

FIG. 1A shows an architectural view of a plasma processing system 100 for etching operations, in accordance with one embodiment of the present invention. FIG. 1B shows a design view of the plasma processing system 100, in accordance with one embodiment of the present invention. The system includes a chamber 101 that includes a chuck 103, and a dielectric window 107. The chuck 103 is defined to support a substrate 105 during plasma processing operations. A substrate, as referred to herein, denotes without limitation, semiconductor wafers, hard drive disks, optical discs, glass substrates, flat panel display surfaces, liquid crystal display surfaces, among essentially any other type of substrate present during semiconductor device fabrication. In one embodiment, the chuck 103 is an electrostatic chuck for supporting and holding the substrate 105. In another embodiment, the chuck 103 is defined to hold the substrate 105 by physical restraint. The chuck 103 includes one or more bias electrodes 104 (bias electrode 104 hereafter) connected to receive radiofrequency (RF) power from a bias RF power supply 111, by way of a bias match circuit 113 and an ion energy and angular distribution function (IEADF) control circuit 115. The bias RF power supply 111 is connected between a reference ground potential 117 and the bias match circuit 113, as indicated by electrical connections 119A and 119B. The bias match circuit 113 is electrically connected to the IEADF control circuit 115, which is in turn electrically connected to the bias electrode 104, as indicated by electrical connection 119C.

In one embodiment where the chuck 103 is defined as an electrostatic chuck, the chuck 103 includes clamp electrodes (not shown) to enable the chucking and de-chucking of the substrate 105. Also, in this embodiment, a filter and a direct current (DC) clamp power supply are provided to effect electrostatic clamping of the substrate 105 to the chuck 103 by way of the clamp electrodes. Also, the chuck 103 can include other control systems, such as lifting pins or the like, for receiving the substrate 105, lowering the substrate 105 onto the chuck 103, and lifting the substrate 105 off of the chuck 103. Additionally, although not shown, pumps are connected to the chamber 101 to provide for control of pressure within the chamber 101, and for exhausting of gaseous byproducts from the chamber 101 during plasma processing operations.

In various embodiments, the dielectric window 107 is defined from a dielectric material, such as a ceramic material or quartz, among others. It should be understood that in other embodiments the dielectric window 107 can be defined from other dielectric materials, so long as the dielectric window 107 is capable of withstanding the conditions to which it is exposed during plasma processing operations within the chamber 101. In some plasma processing operations, the chamber 101 is operated at elevated temperatures within a temperature range extending from about 50 Celsius (C) to about 130 C. In general, the temperature within the chamber 101 will depend on the specific etching process performed. Also, the chamber 101 can operate at reduced-pressure conditions within a pressure range extending from about 10 milliTorr (mT) to about 500 mT.

The system 100 also includes a TCP (transformer coupled plasma) coil 109 disposed over the dielectric window 107 outside the chamber 101. The TCP coil 109 is connected to receive RF power from a TCP RF power supply 121, by way of a TCP match circuit 123. Specifically, the TCP RF power supply 121 is electrically connected between a reference ground potential 125 and the TCP match circuit 123, as indicated by electrical connections 127A and 127B. The TCP match circuit 123 is electrically connected between the TCP power supply 121 and the TCP coil 109, as indicated by electrical connections 127B and 127C. The TCP match circuit 123 is defined to control an impedance of the RF power transmission path to the TCP coil 109, so as to provide for efficient transmission of the RF power to the TCP coil 109.

During plasma processing operations, a process gas is flowed into the chamber 101, and RF power is supplied from the TCP RF power supply 121 to the TCP coil 109. The RF power passing through the TCP coil 109 induces an electromagnetic current in the chamber 101, which acts on the process gas to generate the plasma 129. In this manner, the TCP coil 109 behaves as a primary coil of a transformer, and the plasma 129 behaves as a secondary coil of the transformer. The plasma 129 includes reactive constituents, such as radicals and ions (positive and negative), which act to remove, i.e., etch, materials from the substrate 105 upon contact with the substrate 105.

It should be understood that when the chamber 101 is installed in a fabrication facility, the chamber 101 is coupled to systems that provide for supply of process gases to the chamber 101, exhaust of process gases and byproducts from the chamber 101, monitoring and control of pressure within the chamber 101, monitoring and control of temperature within the chamber 101, and environmental particle control. Also, it should be understood that the chamber 101 can be coupled to a transfer chamber defined to provide for robotic transfer of the substrate 105 into the chamber 101 and robotic removal of the substrate 105 from the chamber 101.

During operation, RF power is transmitted from the bias RF power supply 111 to the bias electrode 104, by way of the bias match circuit 113 and IEADF control circuit 115, to generate and control a direct current (DC) bias voltage present on the substrate 105, which in turns controls a force exerted on an ion population present within the plasma 129 generated above the substrate 105. The RF power transmitted to the bias electrode 104 corresponds to an RF bias voltage applied to the bias electrode 104. Both the DC bias voltage that builds up on the substrate 105 and the RF bias voltage applied to the bias electrode 104 occur simultaneously as a result of applying the RF power from the bias RF power supply 111 to the bias electrode 104, by way of the bias match circuit 113 and IEADF control circuit 115. Therefore, the IEADF control circuit 115 within the bias RF power supply affects both the DC bias voltage on the substrate 105 and the RF bias voltage on the bias electrode 104.

The DC bias voltage is a representation of the average ion energy at a particular point on the substrate 105. The DC bias voltage builds up on the substrate 105 as substrate 105 charging occurs. The IEADF control circuit 115 controls the rate at which the DC bias voltage evolves in a pulsed bias RF power supply mode. In a continuous wave (CW) bias RF power supply mode, the DC bias voltage on the substrate 105 is allowed to reach a steady-state. Therefore, in the CW bias RF power supply mode, the effect of the IEADF control circuit 115 on the DC bias voltage on the substrate 105 is not relevant. Also, it should be understood that the RF waveform seen at the plasma 129 sheath edge (after the bias match circuit 113 and all the capacitive layers in the chuck 103) will be controlled by the IEADF control circuit 115. And, ions respond to the RF waveform at the plasma 129 sheath edge to populate the IEADF accordingly as the ions accelerate toward the substrate 105.

In various embodiments, the RF power supply 111 can be defined to include either a single RF generator or multiple RF generators. Also, the RF power supply 111 can be defined to generate RF power at one or more frequencies. And, in the case of multiple RF generators, the RF power supply 111 can generate RF power at multiple frequencies in a simultaneous manner. The bias match circuit 113 is defined to control an impedance of the RF power transmission path to the bias electrode 104, so as to provide for efficient transmission of the RF power to the bias electrode 104.

The plasma processing chamber 101 utilizes the RF bias power as generated by the RF power supply 111 at various frequencies to generate and control the energetic ion population arriving at the exposed surface of the substrate 105 during plasma processing operations. Depending on the particular etch application being performed, it may be important to control the fraction of ion population at various energies and the associated ion energy and angular distribution functions (IEADF) arriving at the substrate 105. Pulsing of the bias RF power supply 111, i.e., bias pulsing, can be utilized to generate an IEADF at the substrate 105. Bias pulsing operation causes transit of ion populations from various energies toward the substrate 105 over a time period associated with a pulse repetition frequency (PRF) and a pulse duty cycle (D.C.) of the supplied bias RF power. However, it is also necessary during bias pulsing operation to control the IEADF to which the substrate 105 is exposed in order to obtain a specific plasma processing result on the substrate 105. In accordance with various embodiments of the present invention, the IEADF circuit 115 is defined and operated to control the IEADF during bias pulsing operation in order to control populations of low and high energy ions to which the substrate 105 is exposed.

As discussed, the bias RF power is supplied from the bias RF power supply 111, through the bias match circuit 113, through the IEADF circuit 115, to the bias electrode 104. From the bias electrode 104, the bias RF power is transmitted through the plasma 129 to surrounding structures of the chamber 101 that are electrically grounded. Circuit components within the bias match circuit 113 provide impedance matching to enable efficient transmission of the bias RF power through the plasma 129. The bias RF power supply circuit can be operated in either continuous wave bias RF power supply mode or pulsed bias RF power supply mode.

Figure 2:
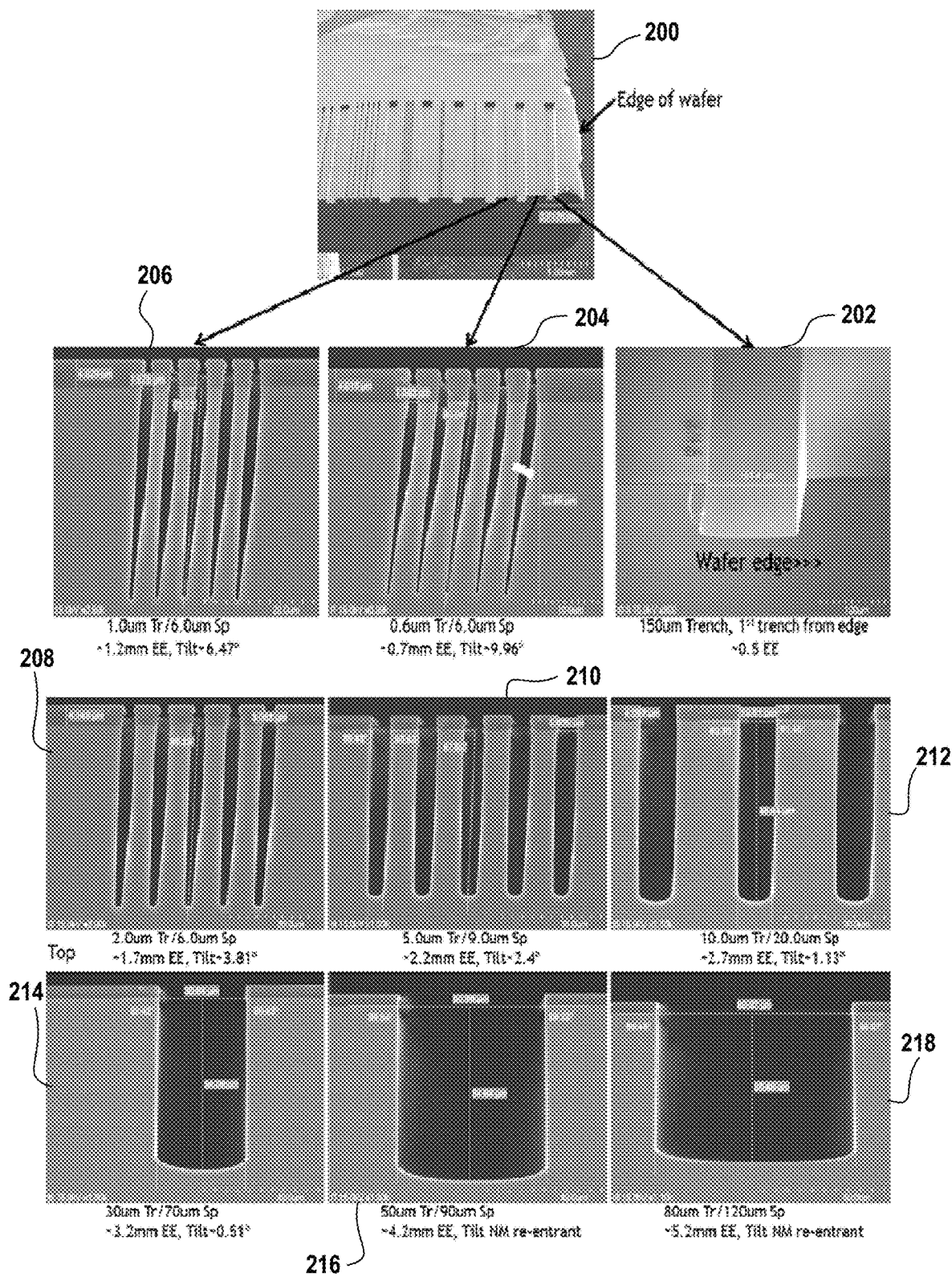
FIG. 2 illustrates several scanning electron microscope (SEM) images, showing tilting of features etched in the edge region of a wafer.

FIG. 2 illustrates several scanning electron microscope (SEM) images, showing tilting of features etched in the edge region of a wafer. The SEM image 200 shows a perspective view of a cutaway portion at the edge of the wafer. SEM image 202 shows a perspective view of a 150 micron (µ) trench at about 0.5 mm from the edge of the wafer. SEM image 204 shows a cross-section of several 0.6µ trenches located at about 0.7 mm from the edge of the wafer. The tilt of the features is quite noticeable at approximate 9.96 degrees. SEM image 206 shows a cross-section of several 1.0µ trenches at about 1.2 mm from the edge of the wafer. The tilt of the features is approximately 6.47 degrees. SEM image 208 shows a cross-section of several 2µ trenches at approximately 1.7 mm from the wafer edge, which exhibit a tilt of about 3.81 degrees. SEM image 210 shows a cross-section of several 5µ trenches at about 2.2 mm from the wafer edge, which exhibit a tilt of about 2.4 degrees. SEM image 212 shows a cross-section of several 10µ trenches at about 2.7 mm from the wafer edge, which exhibit a tilt of about 1.13 degrees. SEM image 214 shows a cross-section of a 30µ trench at about 3.2 mm from the wafer edge, exhibiting a tilt of about 0.51 degrees. SEM image 216 shows a cross-section of a 50µ trench at about 4.2 mm from the wafer edge. SEM image 218 shows a cross-section of an 80µ trench at about 5.2 mm from the wafer edge.

Figure 3:
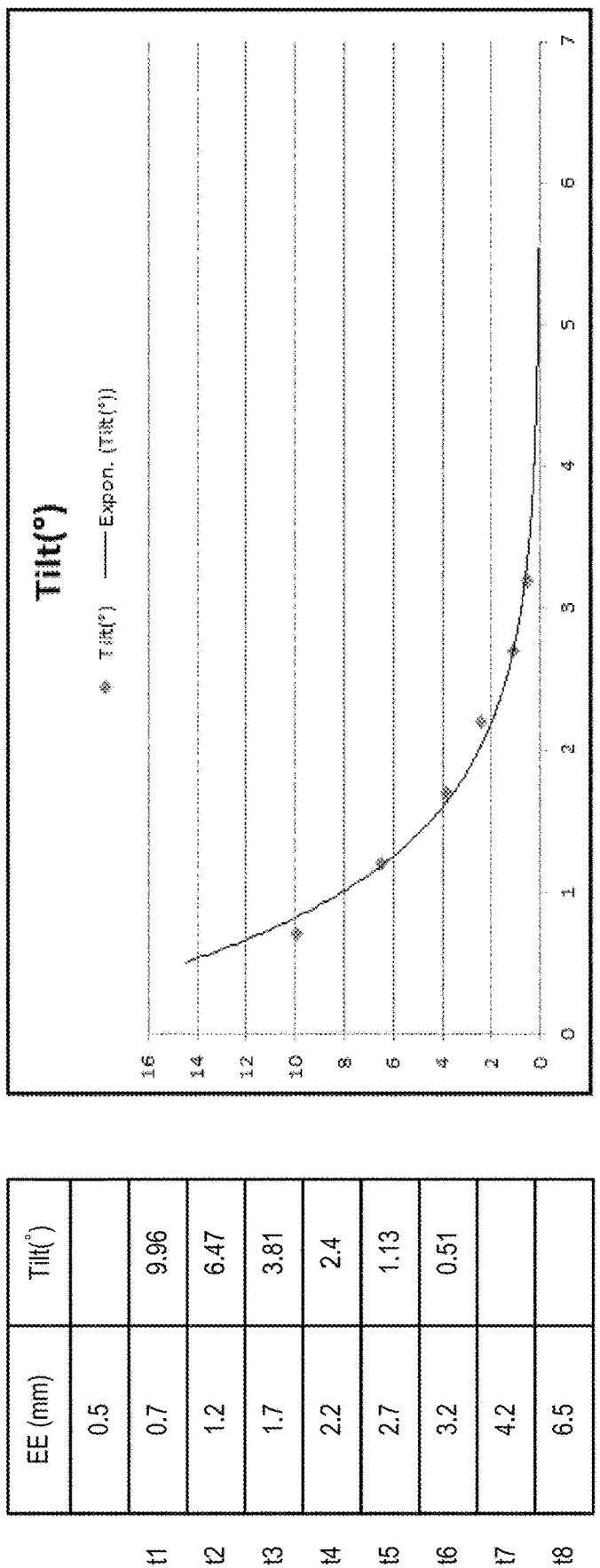
FIG. 3 is a graph illustrating degrees of feature profile tilt versus distance from the edge of the wafer.

FIG. 3 is a graph illustrating degrees of feature profile tilt versus distance from the edge of the wafer. As can be seen, there is an exponential rise in the amount of tilt as the distance from the edge of the wafer decreases. At 3.2 mm from the wafer edge, a tilt of 0.37 degrees was observed, which as noted above, may not be suitable for a MEMS device such as a Si gyroscope.

Figure 4A:
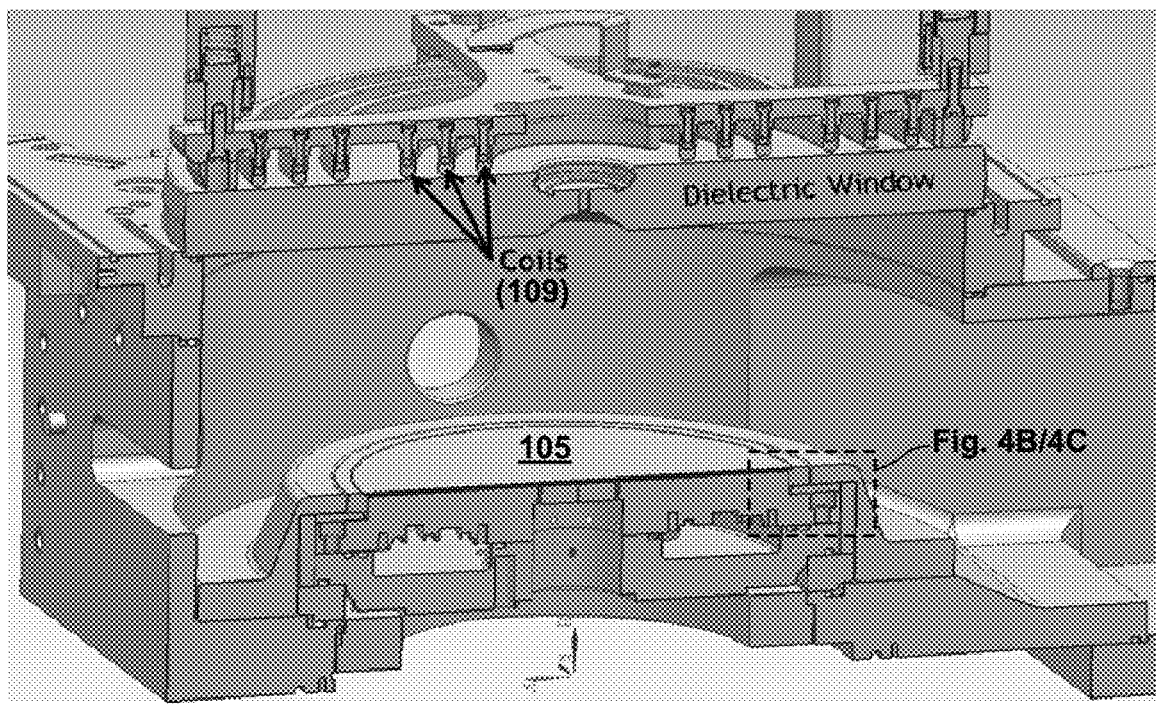
FIG. 4A illustrates a cutaway perspective view of a TCP® 9400DSiE™ (Deep Silicon Etch) tool, manufactured by Lam Research Corporation, in accordance with implementations of the disclosure.
Figure 4B:
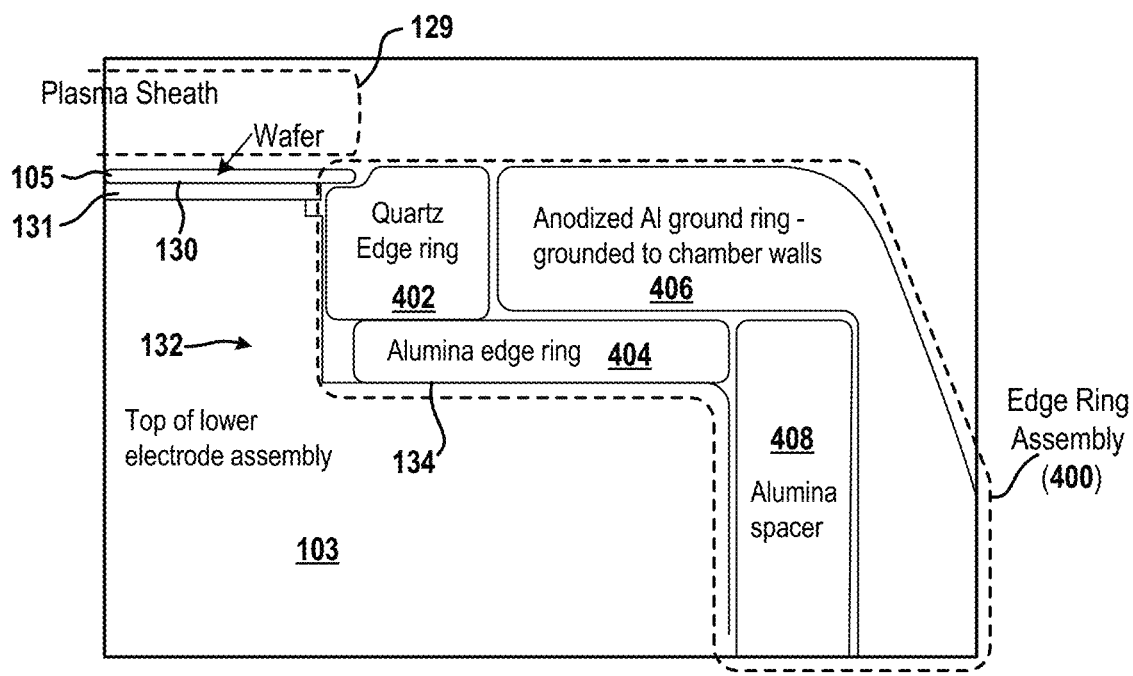
FIG. 4B illustrates a close-up cross-section view of a portion of the tool including an existing edge ring assembly 400.
Figure 4C:
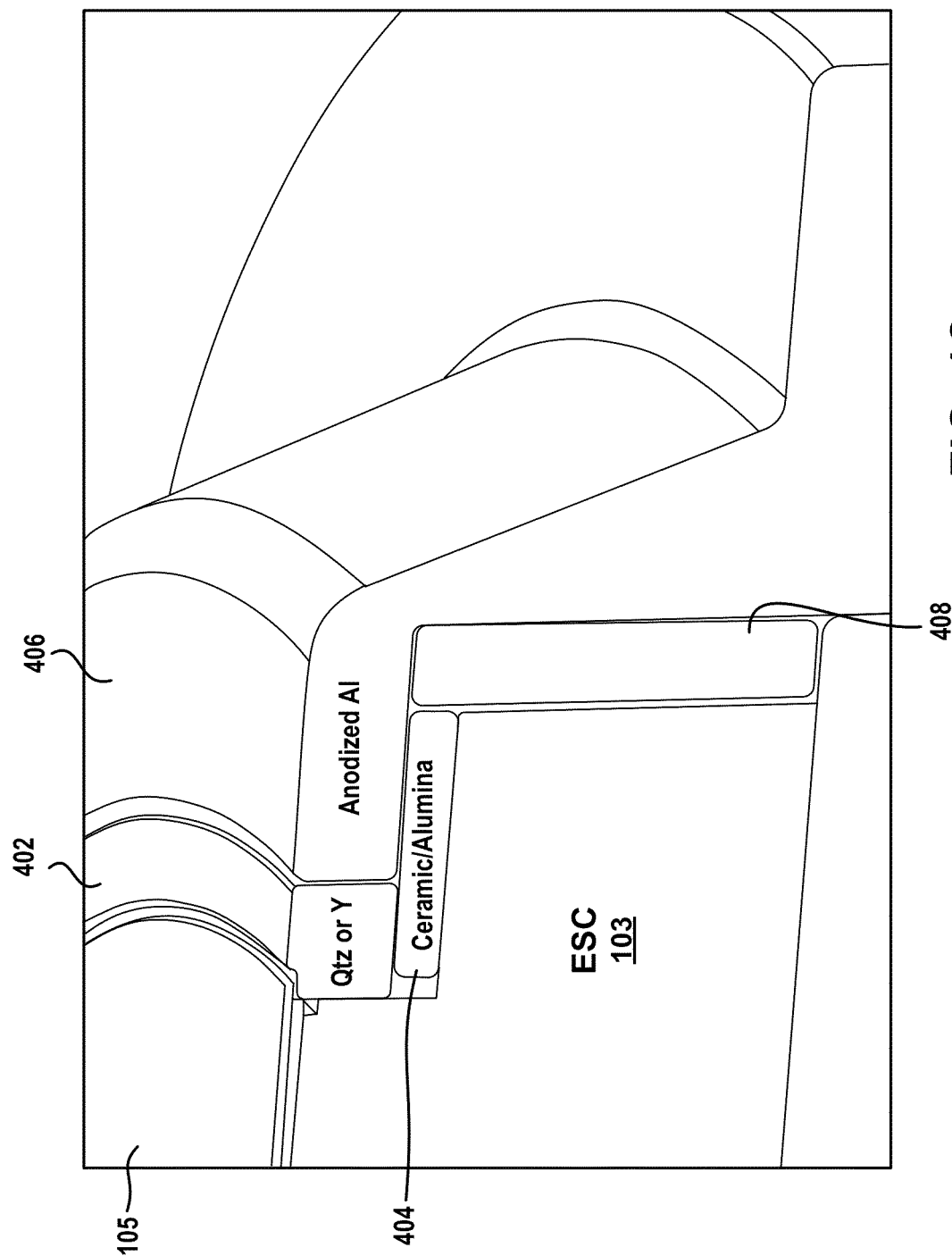
FIG. 4C illustrates a close-up cutaway view of a similar portion as that of FIG. 4B.

FIG. 4A illustrates a cutaway perspective view of a TCP® 9400DSiE™ (Deep Silicon Etch) tool, manufactured by Lam Research Corporation, in accordance with implementations of the disclosure. FIG. 4B illustrates a close-up cross-section view of a portion of the tool including an existing edge ring assembly 400. FIG. 4C illustrates a close-up cutaway view of a similar portion as that of FIG. 4B. As shown, the electrostatic chuck (ESC) 103 may have a ceramic top 131. Furthermore, ESC 103 has an annular step 132 that defines an annular shelf 134. The height of the annular shelf 134 is lower than the height of the top surface 130 of the ESC 103. An edge ring assembly 400 is at least partially positioned over the annular shelf 134 defined by the annular step 132.

The edge ring assembly 400 includes a quartz edge ring 402 surrounding the top surface 130 of the ESC 103, and disposed in the annular step 132 above the annular shelf 134. An alumina edge ring 404 is disposed in the annular step 132 below the quartz edge ring and over the annular shelf 134. An alumina spacer 408 is defined surrounding the alumina edge ring 404. An anodized aluminum (Al) ground ring 406 is defined surrounding the quartz edge ring 402 and the alumina spacer. The ground ring 406 is grounded to the chamber walls.

Also conceptually illustrated is the plasma sheath 129. It will be noted that the plasma sheath 129 extends approximately to the edge region of the wafer 105, but collapses at this point due to the electrically insulating quartz edge ring 402. The result is that the sheath is not continuous at and beyond the periphery of the wafer 105, resulting in tilting of ion trajectories away from normal to the wafer top surface, thereby resulting in tilting of etched features.

Figure 5:
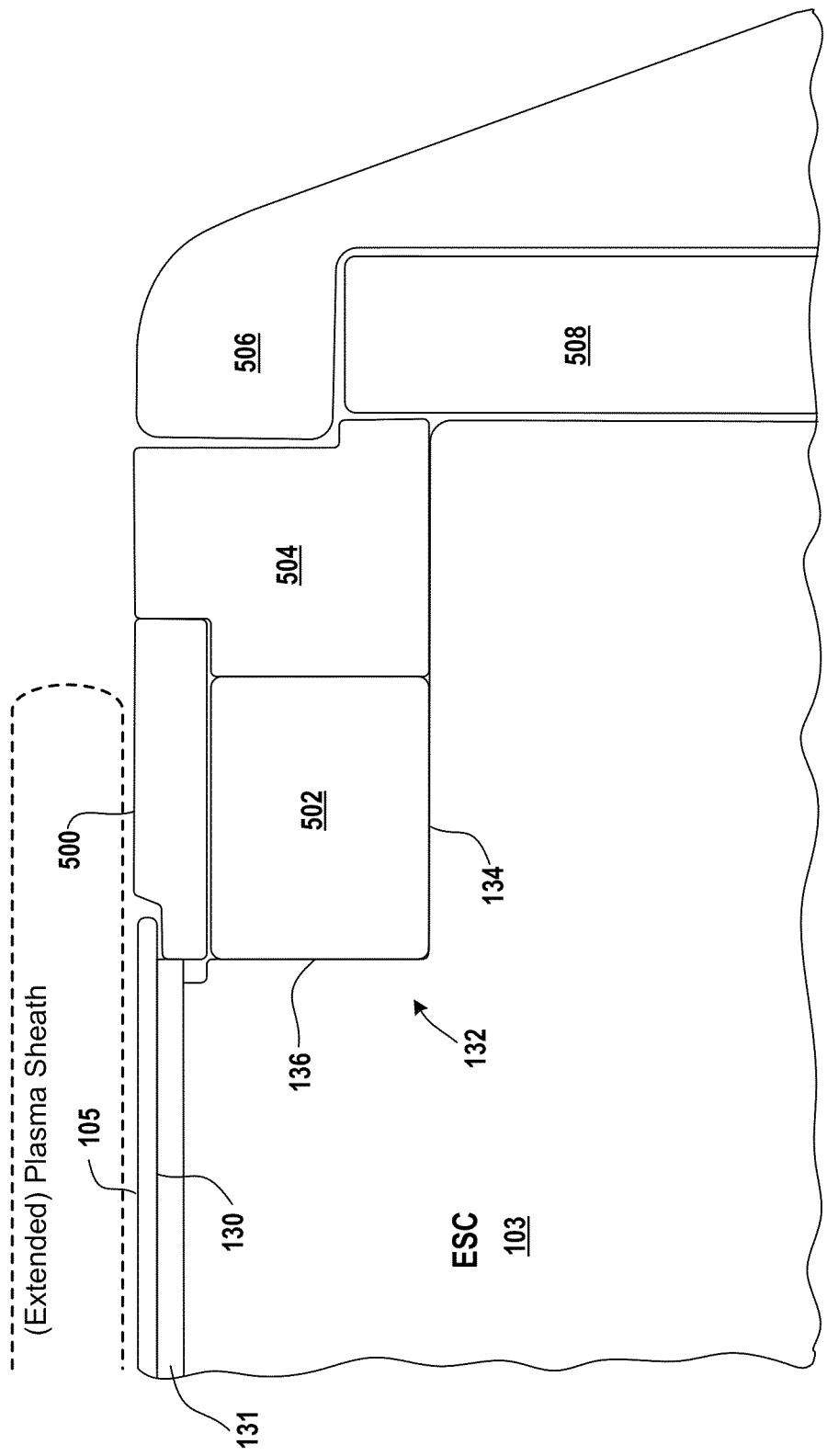
FIG. 5 illustrates an edge ring assembly that is configured to reduce feature profile tilting at the wafer edge, in accordance with implementations of the disclosure.

FIG. 5 illustrates an edge ring assembly that is configured to reduce feature profile tilting at the wafer edge, in accordance with implementations of the disclosure. The edge ring assembly includes a top edge ring 500 that surrounds the top surface of the ESC 103. In various implementations, the top edge ring 500 is defined from an insulating material, such as quartz or yttrium oxide (yttria). The top edge ring 500 is disposed above the annular shelf 134 of the annular step 132. Below the top edge ring 500 is a passively powered electrode ring 502.

In some implementations, the electrode ring 502 is defined from hard anodized aluminum, such that the anodized layer on the surface of the electrode ring 502 provides electrical insulation of the electrode ring 502 from the ESC 103. In some implementations, the outer surfaces of the ESC which contact or are adjacent to the electrode ring 502, such as the sidewall 136 and the annular shelf 134, may also be anodized to provide electrical insulation between the ESC and the electrode ring. In still other implementations, a separate insulator (not shown) is defined between the ESC and the electrode ring. The electrode ring 502 is disposed in the annular step over the annular shelf 134, and surrounds a sidewall 136 of the ESC that is defined by the annular step 132.

As discussed further below, there is a gap between the electrode ring 502 and the ESC 103. The electrode ring 502 can be configured so that the gap provides for a desired level of capacitive coupling to the ESC when RF power is applied to the ESC. The capacitive coupling provides RF power to the electrode ring 502, so as to extend the plasma sheath out to or beyond the edge of the wafer, and improve profile tilting at the edge of the wafer.

In the illustrated implementation, a quartz outer ring 504 surrounds both of the top edge ring 500 and the electrode ring 502. The quartz outer ring 504 separates the electrode ring 502 from the ground ring 506. A spacer 508 (e.g. alumina) separates the ESC from the ground ring 506.

In some implementations, the top/upper edge ring 500 is annularly shaped, extending between inner and outer diameters in the range of about 190 mm to 230 mm. In some implementations, the height of the top edge ring 500 is about 2 to 5 mm. In some implementations, the height of the top edge ring 500 is about 2 to 4 mm. In some implementations, the height of the top edge ring 500 is about 3 mm. In some implementations, the height of the top edge ring 500 is about 3.2 mm. In some implementations, the radial thickness/width of the top edge ring 500 is about 10 to 25 mm. In some implementations, the radial thickness/width of the top edge ring 500 is about 15 to 25 mm. In some implementations, the radial thickness/width of the top edge ring 500 is about 11 to 14 mm. In some implementations, the radial thickness/width of the top edge ring 500 is about 12 to 13 mm.

In some implementations, the lower inner edge ring is annularly shaped, extending between inner and outer diameters in the range of about 190 mm to 225 mm In some implementations, the height of the electrode ring 502 is about 8 to 15 mm. In some implementations, the height of the electrode ring 502 is about 9 to 12 mm. In some implementations, the height of the electrode ring 502 is about 9.7 mm. In some implementations, the radial thickness/width of the electrode ring 502 is about 15 to 20 mm. In some implementations, the radial thickness/width of the electrode ring 502 is about 10 to 15 mm. In some implementations, the width of the electrode ring 502 is about 11 to 14 mm. In some implementations, the width of the electrode ring 502 is about 12 to 13 mm.

Figure 6:
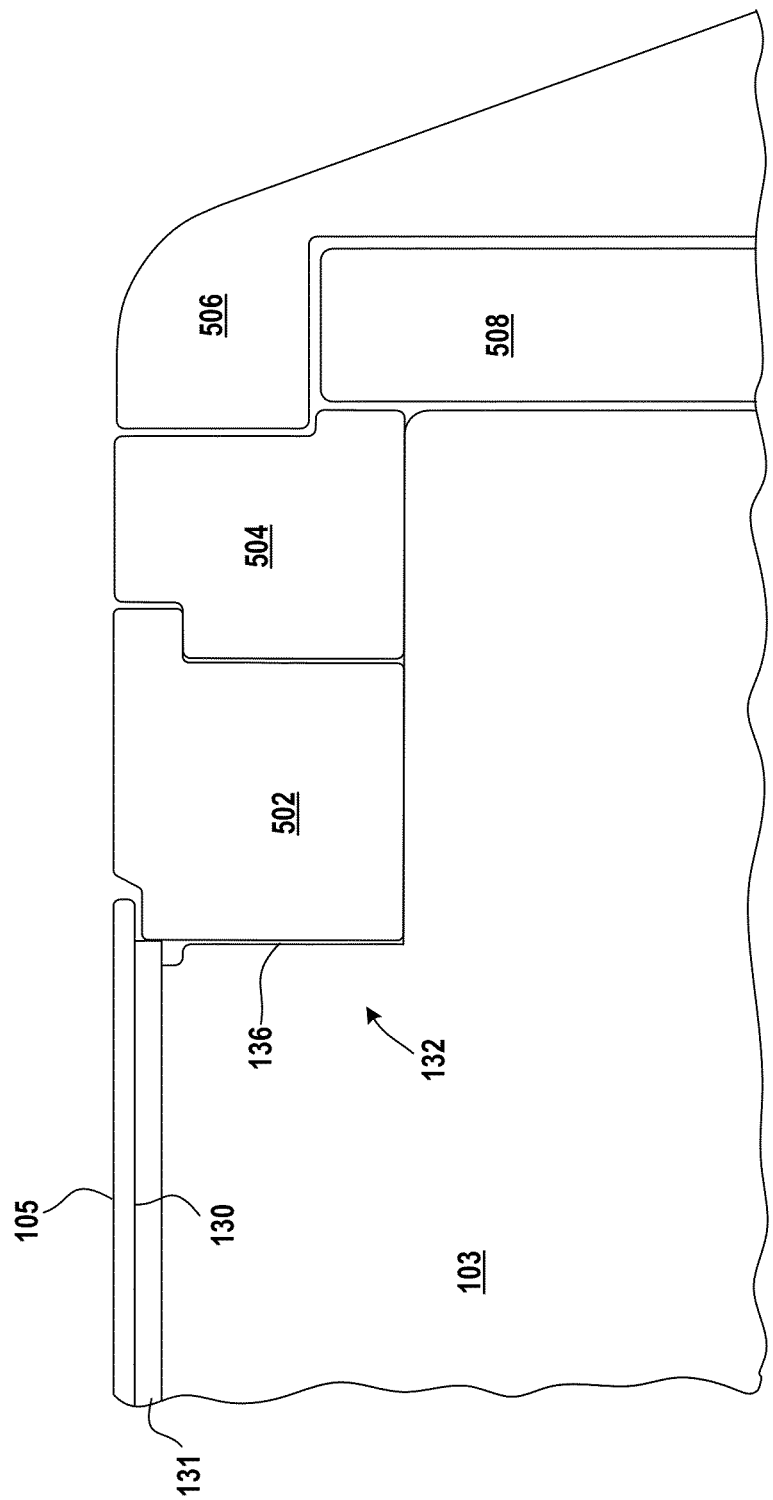
FIG. 6 illustrates an edge ring assembly, in accordance with implementations of the disclosure.

FIG. 6 illustrates an edge ring assembly, in accordance with implementations of the disclosure. The illustrated implementation of FIG. 6 is similar to that of FIG. 5, except that the top edge ring has been eliminated and the height of the electrode ring 502 has been increased by an amount approximately equivalent to the height of the top edge ring 502. This configuration provides for improved electrical performance due to the absence of an additional overlying insulating layer such as the top edge ring. However, the exposed surface (e.g. anodized aluminum surface) of the electrode ring can be sputtered and may cause yield loss at the wafer edge.

In some implementations, the height of the electrode ring 502 is about 10 to 16 mm. In some implementations, the height of the electrode ring 502 is about 12 to 14 mm. In some implementations, the height of the electrode ring 502 is about 12.9 mm. In some implementations, the width of the electrode ring 502 is about 11 to 14 mm. In some implementations, the width of the electrode ring 502 is about 12 to 13 mm. In some implementations, the width of the electrode ring 502 is about 12.5 mm.

Figure 7A:
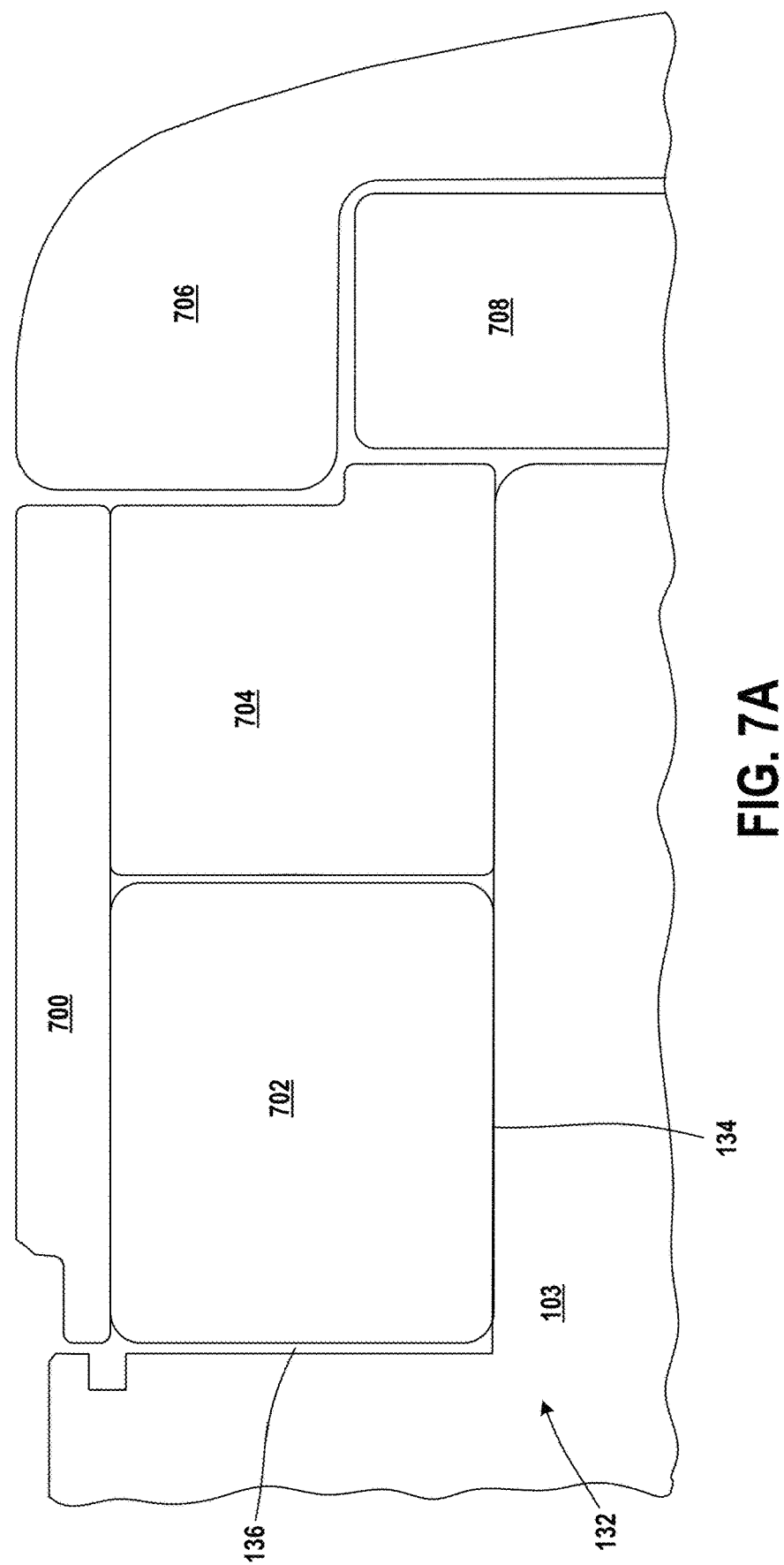
FIG. 7A illustrates a cross-section of an edge ring assembly, in accordance with implementations of the disclosure.

FIG. 7A illustrates a cross-section of an edge ring assembly, in accordance with implementations of the disclosure. In the illustrated implementation, a quartz upper edge ring 700 is defined surrounding the top surface of the ESC. The thickness of the upper edge ring 700 is reduced as compared to other embodiments to provide for improved electrical performance while still providing suitable durability for purposes of handling. In some implementations, the thickness of the upper edge ring 700 is about 2 to 3 mm. In some implementations, the thickness of the upper edge ring 700 is about 2.5 mm.

A passively powered hard anodized aluminum electrode ring 702 is disposed below the upper edge ring in the annular step 132 over the annular shelf 134. The electrode ring 702 surrounds (and is radially adjacent to) the sidewall 136 defined by the annular step 132. A quartz lower outer ring 704 surrounds (and is radially adjacent to) the electrode ring 702, and is also disposed below the upper edge ring 700 in the annular step 132 and disposed over the annular shelf 134. A ceramic/alumina spacer 708 surrounds (and is radially adjacent to) a lower portion of the lower outer ring 704. A ground ring 706 surrounds (and is radially adjacent to) the upper edge ring 700, the lower outer ring 704, and the spacer 708.

In some implementations, the height of the electrode ring 702 is about 9 to 12 mm. In some implementations, the height of the electrode ring 702 is about 10 to 11 mm. In some implementations, the height of the electrode ring 702 is about 10.4 mm.

Figure 7B:
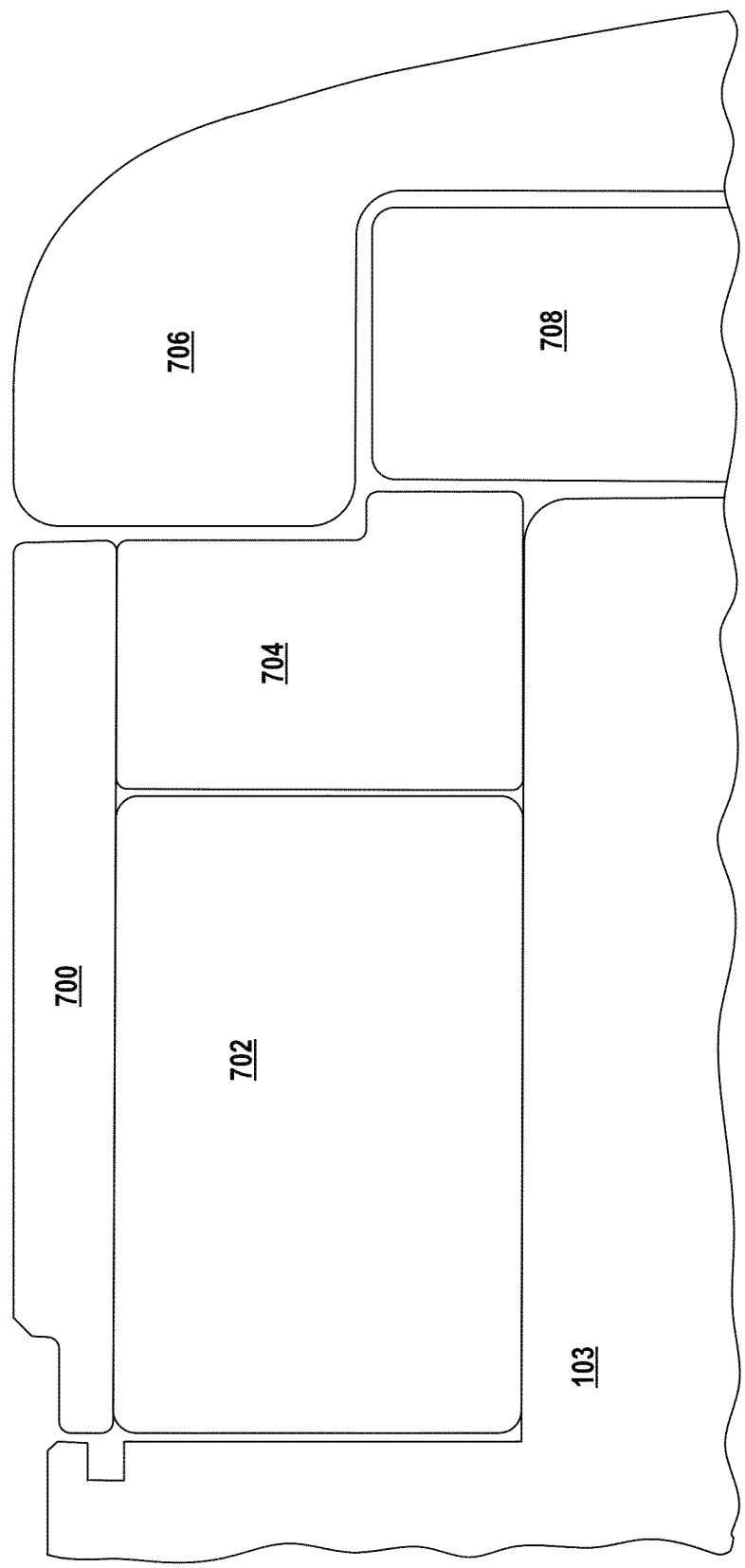
FIG. 7B illustrates an implementation wherein the width of the electrode ring 702 has been increased as compared to that of FIG. 7A, in accordance with implementations of the disclosure.

In various implementations, the width of the electrode ring 702 may vary. In the implementation shown at FIG. 7B, the width of the electrode ring 702 has been increased as compared to that of FIG. 7A. In some implementations, the width of the electrode ring 702 is about 10 to 20 mm. In some implementations, the width of the electrode ring 702 is about 15 to 18 mm. In some implementations, the width of the electrode ring 702 is about 16 mm. An advantage of providing a wider electrode ring is to provide greater capacitive coupling and transfer of power from the ESC across a wider area, which may provide for greater extension of the plasma sheath over the upper edge ring area.

Figures 8A, 8B:
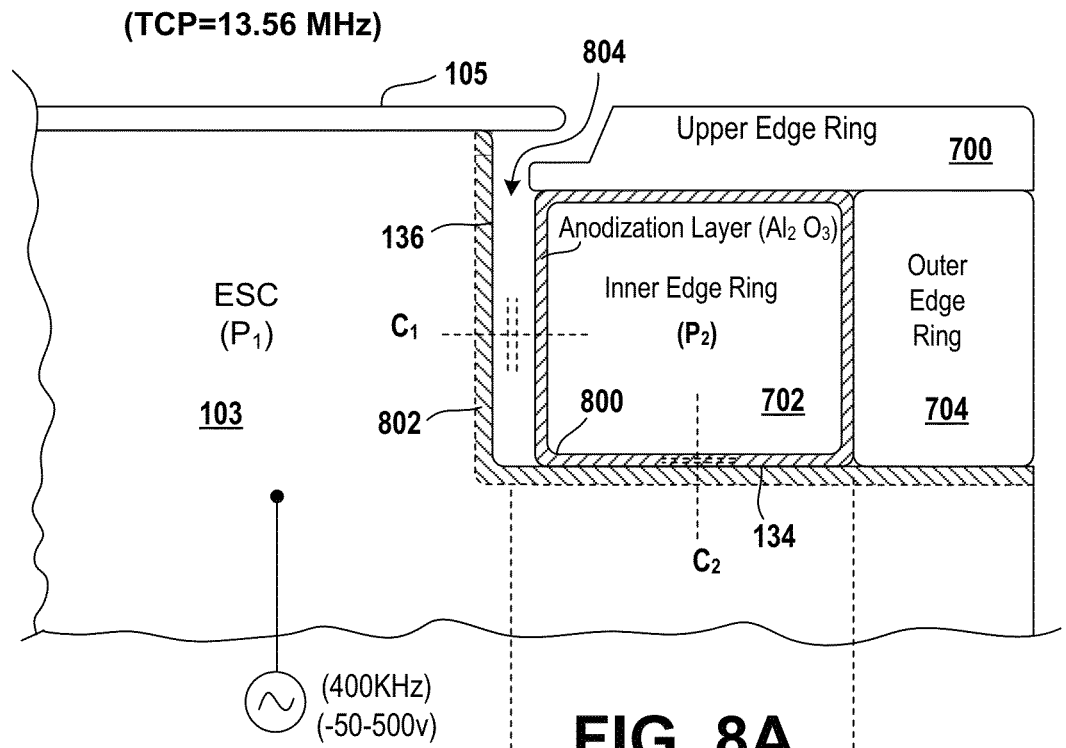
FIG. 8A illustrates a cross-section of an edge ring assembly, conceptually illustrating the capacitive coupling to the ESC, in accordance with implementations of the disclosure.
FIG. 8B illustrates power as a function of radial location, correlated to the configuration of FIG. 8A, in accordance with implementations of the disclosure.

FIG. 8A illustrates a cross-section of an edge ring assembly, conceptually illustrating the capacitive coupling to the ESC, in accordance with implementations of the disclosure. The electrode ring 702, which defines a lower inner edge ring, can be defined from a conductive material and may include an insulating outer layer 800. In some implementations, the electrode ring 702 is a hard anodized aluminum ring, wherein the insulating outer layer 800 is defined by the anodization layer of $Al_2O_3$. In some implementations, the ESC 103 may include an insulating layer 802 that is defined on the outer surface of the sidewall 136 and the annular shelf 134 which are adjacent to the electrode ring 702. In some implementations, the insulating layer 802 of the ESC is an anodization layer (e.g. of aluminum)

The electrode ring 702 is separated from the sidewall 136 by an annular gap 804, which is configured to provide for thermal expansion of the ESC during plasma processing. Furthermore, the gap 804 defines another insulating layer of gas/air that is between the sidewall 136 and the inner surface of the electrode ring 702. Thus a first capacitance $C_1$ is defined in accordance with the area of the inner surface of the electrode ring 702, the corresponding area of the sidewall 136, and the distance separating the conductive portions of the electrode ring and the ESC along these areas (which defines a dielectric separation). The annular gap can be tuned to modify an anticipated RF power on the ESC that is passively transferred to the electrode ring. The RF power in the electrode ring is passively and dynamically set by setting the capacitance value, as set by the distance between the electrode ring and the ESC, so that power transferred to the ESC is transferred to the electrode ring in a predefined relative amount. Thus, a correlation between power supplied to ESC and power passively communicated to the electrode ring is achieved, so that the resulting power communicated to the electrode ring is predefined based on a physical separation of adjacent conductive portions of the ESC and the electrode ring, which is a dielectric separation, and the dielectric separation amount defines a capacitance amount that throttles and sets the power that is communicated to the electrode ring.

In the illustrated embodiment, the bottom surface of the electrode ring 702 contacts the annular shelf 134. In a similar manner and effect to the first capacitance, a second capacitance $C_2$ is defined in accordance with the area of the bottom surface of the electrode ring 702, and the distance separating the conductive portions of the electrode ring and the ESC along this area. The overall capacitance between the electrode ring 702 and the ESC 103 is defined from both of the capacitances $C_1$ and $C_2$.

It will be appreciated that the capacitances $C_1$ and $C_2$ can be tuned to achieve a desired effect. For example, it may be desirable to tune the capacitances to achieve a predefined drop in power as transferred through capacitive coupling from the ESC to the electrode ring 702. FIG. 8B illustrates power as a function of radial location, correlated to the configuration of FIG. 8A, in accordance with implementations of the disclosure. A power $P_1$ is developed at the top surface of the substrate as provided through the ESC. A power $P_2$ is developed at the top surface of the upper edge ring. Because the power $P_2$ is produced via the capacitive coupling of the electrode ring to the ESC, the parameters which affect the capacitive coupling can be specifically tuned to provide for the power $P_2$ to be at a predefined fraction/percentage of the power $P_1$. In some implementations, the power $P_2$ is configured to be at about 50% to less than 100% of the power $P_1$. In some implementations, the power $P_2$ is configured to be at about 60% to 90% of the power $P_1$. In some implementations, the power $P_2$ is configured to be at about 70% to 80% of the power $P_1$.

Figure 9:
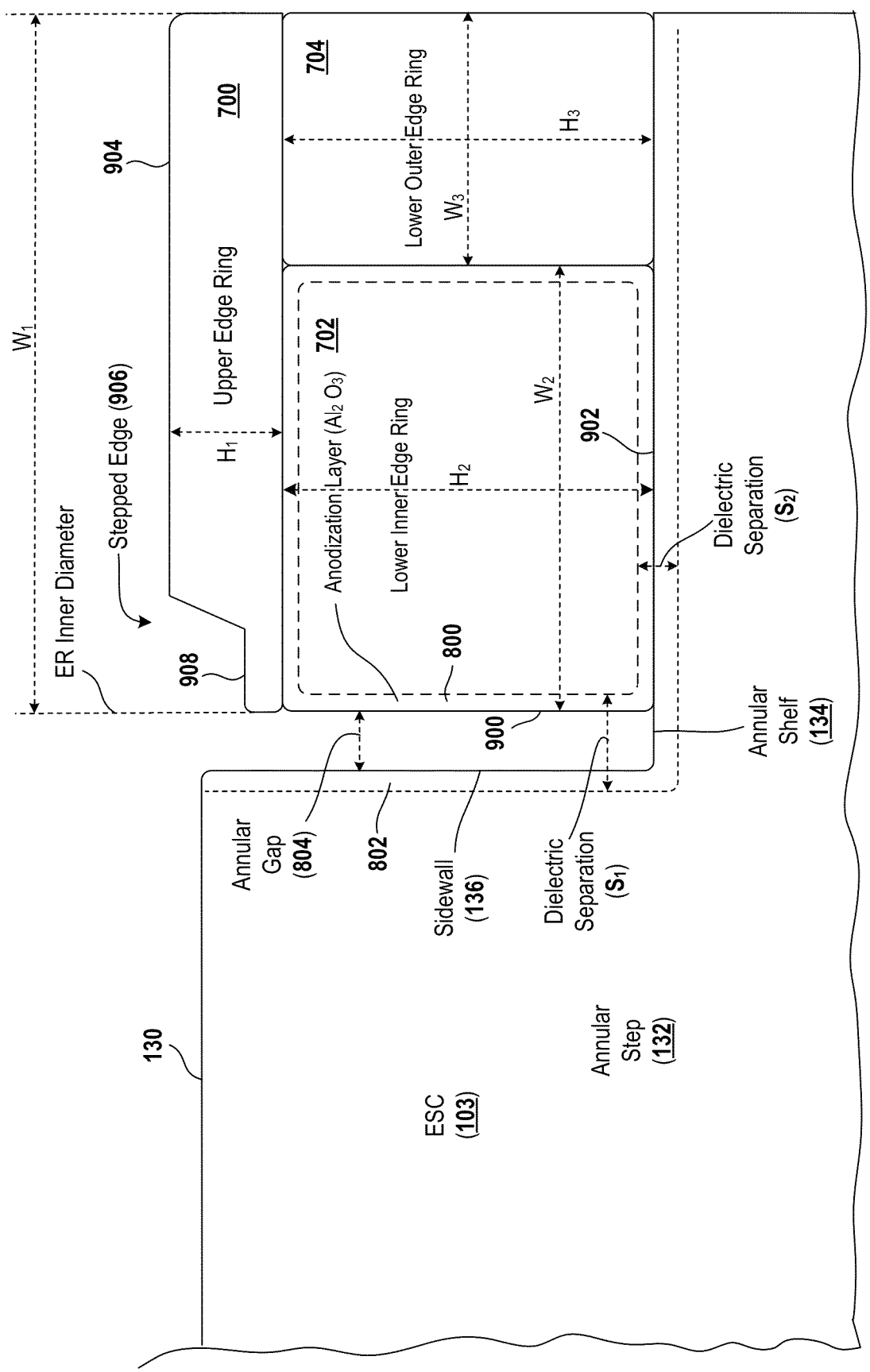
FIG. 9 illustrates a cross section of an edge ring assembly, in accordance with implementations of the disclosure.

FIG. 9 illustrates a cross section of an edge ring assembly, in accordance with implementations of the disclosure. As shown, the upper edge ring 700 is an annular structure having a height $H_1$ and a radial width $W_1$. The radial width $W_1$ extends from an inner diameter of the upper edge ring to an outer diameter of the upper edge ring. The upper edge ring has a top surface 904, and the top surface 904 of the upper edge ring 700 has a stepped edge 906 defined at the inner diameter of the upper edge ring. A lower portion 908 of the stepped edge 906 is configured to sit at a lower height than the top surface 130 of the ESC, such that the substrate extends over the lower portion of the stepped edge. The upper edge ring is defined from an insulating material, such as quartz or yttria.

An annular electrode ring 702 defines lower inner edge ring and is capacitively coupled to the ESC 103. The electrode ring is disposed below the upper edge ring in the annular step 132 and directly over the annular shelf 134. The electrode ring 702 has an inner surface 900 that is separated from the sidewall 136 by an annular gap 804. The annular gap 804 defines a radial distance between the inner surface 900 and the sidewall 136, which can be configured to provide for a predefined capacitance. In some implementations, the annular gap 804 defines a radial separation distance of about 0.5 to 1 mm. A bottom surface 902 of the electrode ring 702 rests on the annular shelf 134. The electrode ring 702 has a height $H_2$ and a radial width $W_2$. The electrode ring 702 is defined from a conductive material, and may include an insulating surface material. In one implementation, the electrode ring 702 is defined from an anodized aluminum material having an aluminum core and an anodized surface.

A lower outer edge ring 704 surrounds the electrode ring 702. The lower outer edge ring 704 is an annular structure having a height $H_3$ and a radial width $W_3$. The lower outer edge ring 704 is disposed below the upper edge ring 700 and directly over the annular shelf 134. The lower outer edge ring 704 is defined from an insulating material such as quartz.

A first dielectric separation $S_1$ separates conductive portions of the ESC 103 and the electrode ring 702 along the sidewall 136 of the annular step 132 and the corresponding inner surface 900 of the electrode ring 702. A second dielectric separation $S_2$ separates the conductive portions of the ESC 103 and the electrode ring 702 along the annular shelf 134 and the corresponding bottom surface 902 of the electrode ring 702. The dielectric separations $S_1$ and $S_2$ are configurable and defined based on the thicknesses of insulating layers 800 and 802 (which can be anodization layers) and the radial width of the annular gap 804 (affecting dielectric separation $S_1$).

It should be appreciated that any of the aforementioned dimensions and parameters may be tuned to achieve a reduction in tilting of etched features at the edge region of the substrate, which is achieved through the passive transfer of power from the ESC 103 to the electrode ring 702.

Figure 10:
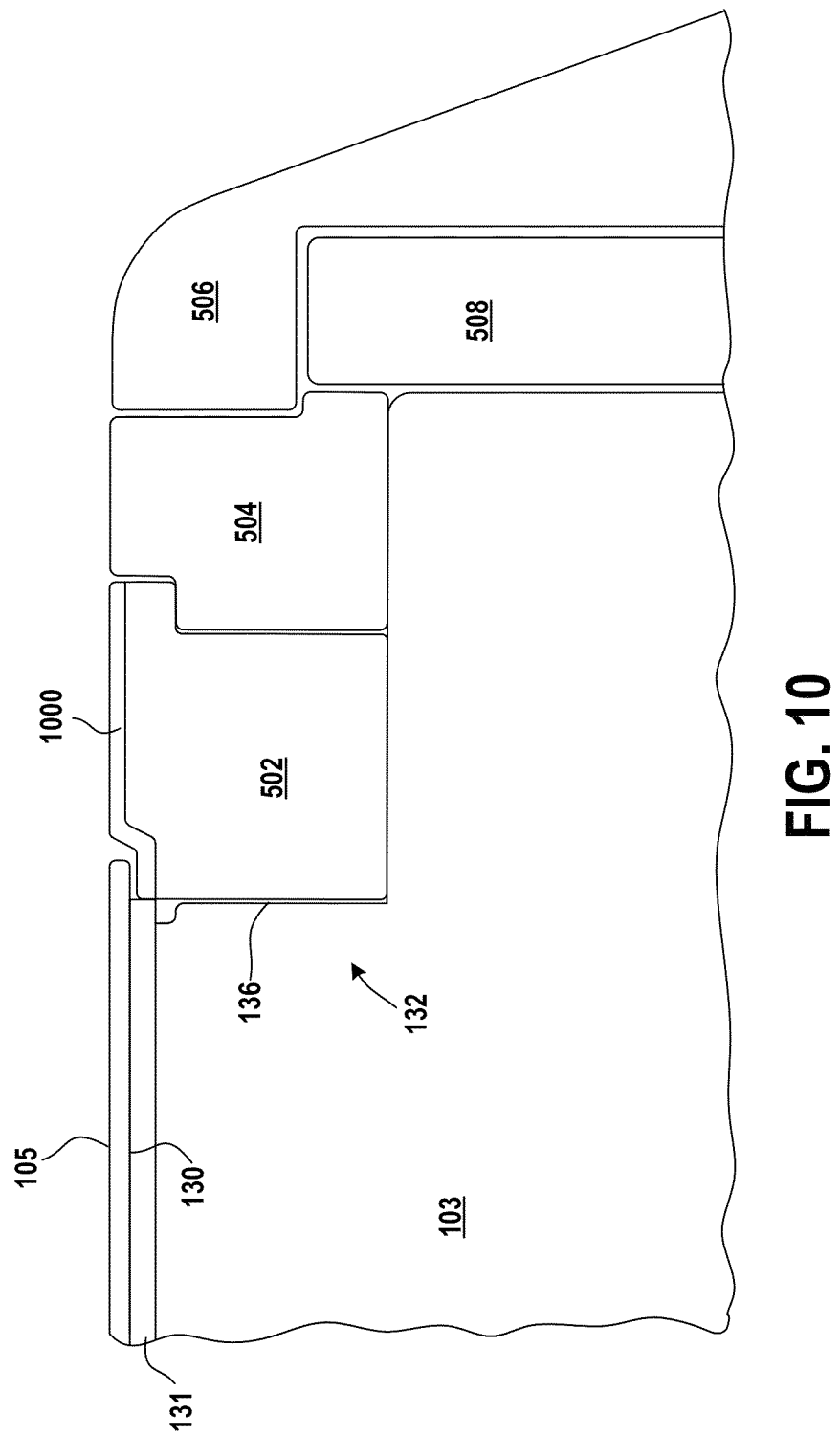
FIG. 10 illustrates an edge ring assembly, in accordance with implementations of the disclosure.

FIG. 10 illustrates an edge ring assembly, in accordance with implementations of the disclosure. The implementation of FIG. 10 is similar to that of FIG. 6, except that to protect the electrode ring 502 against sputtering, a yttria dielectric coating 1000 is provided over the anodized aluminum surface of the electrode ring. In various implementations, the yttria coating may have a thickness ranging from about 50 um to 400 um.

Figure 11:
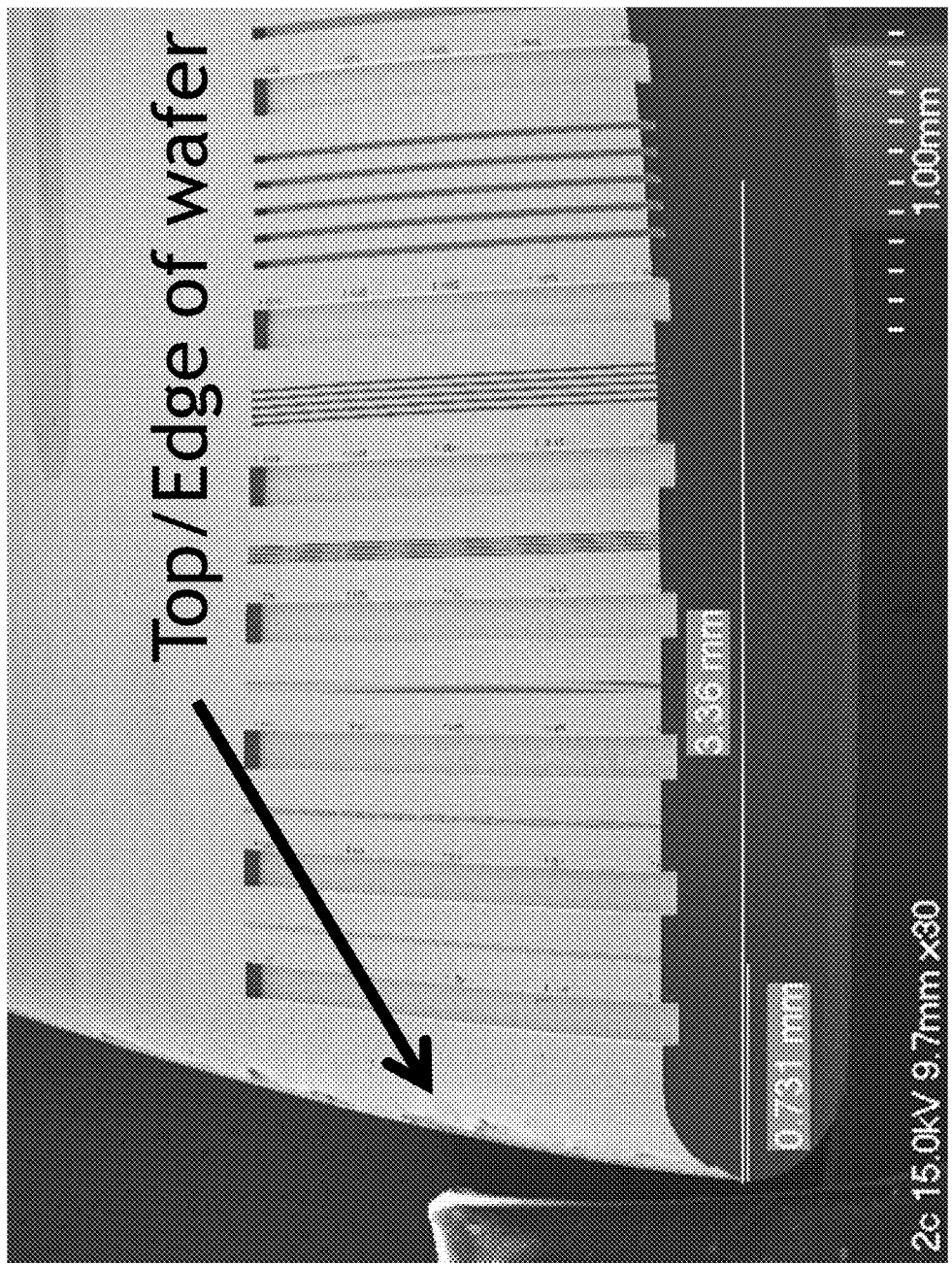
FIG. 11 is a SEM image showing a perspective view of a radial cutaway of a test wafer after performance of a baseline process including oxide breakthrough, deposition, and etch processes.

The effect of the yttria coated hard anodized aluminum (HAA) electrode ring was tested versus a standard hardware setup for a 200 mm checkerboard test wafer using a 9400DSiE II tool manufactured by Lam Research Corporation. FIG. 11 is a SEM image showing a perspective view of a radial cutaway of a test wafer after performance of a baseline process including oxide breakthrough, deposition, and etch processes. As shown, there are a series of etched features beginning at approximately 0.5 mm from the edge of the wafer.

Figures 12A, 12B:
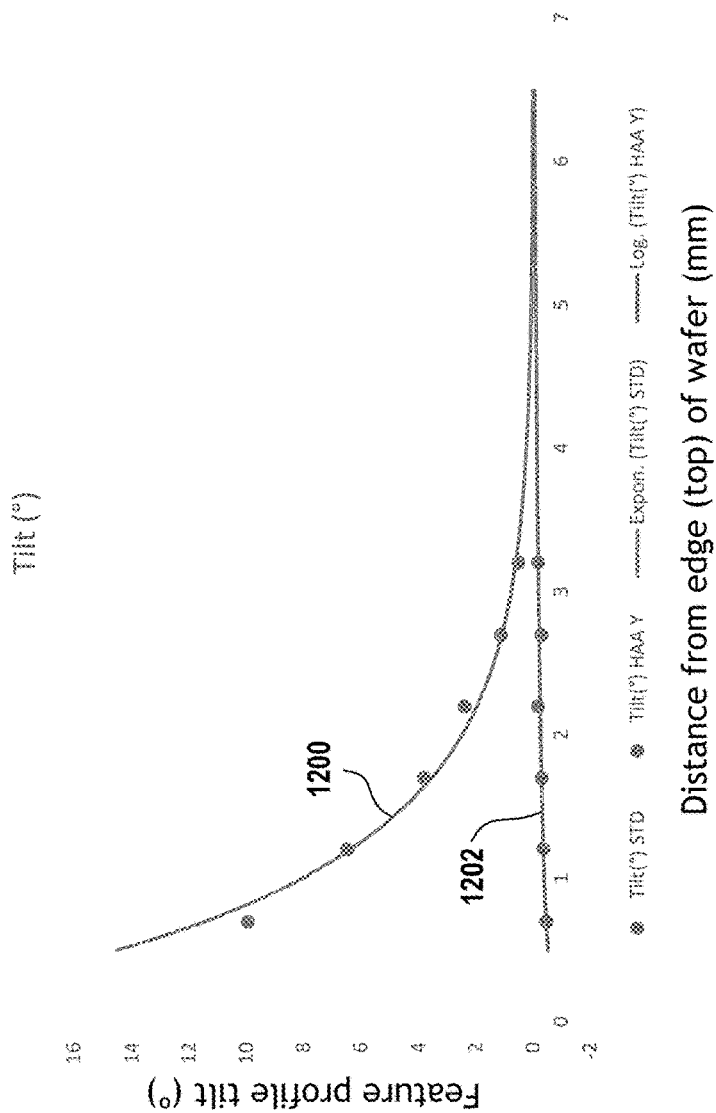
FIG. 12A is a chart showing tilt angles of features at various distances from the wafer edge, comparing results from a standard setup ("STD") and a setup employing a yttria coated HAA electrode ring ("HAA Y").
FIG. 12B is a graphical plot of the data shown at FIG. 12A, including fitted curves.

FIG. 12A is a chart showing tilt angles of features at various distances from the wafer edge, comparing results from a standard setup ("STD") and a setup employing a yttria coated HAA electrode ring ("HAA Y"). FIG. 12B is a graphical plot of the data shown at FIG. 12A, including fitted curves. The curve 1200 indicates feature profile tilt as a function of distance from the edge for a standard setup. As shown, the feature profile tilt increases exponentially when approaching the edge of the wafer. The curve 1202 indicates feature profile tilt as a function of distance from the edge for a setup employing a yttria coated HAA electrode ring, in accordance with implementations of the disclosure. As shown, the feature profile tilt is dramatically reduced as compared to the standard setup.

FIGS. 13A, 13B, and 13C are SEM images showing cross sections of features which are approximately 0.5 mm, 0.7 mm, and 1.2 mm from the wafer edge, respectively, which have been processed using the standard setup. FIGS. 13D, 13E, and 13F are corresponding SEM images showing cross sections of features which are approximately 0.5 mm, 0.7 mm, and 1.2 mm from the wafer edge, respectively, which have been processed using the setup employing the yttria coated HAA electrode ring.

FIGS. 14A, 14B, and 14C are SEM images showing cross sections of features which are approximately 1.7 mm, 2.2 mm, and 2.7 mm from the wafer edge, respectively, which have been processed using the standard setup. FIGS. 14D, 14E, and 14F are corresponding SEM images showing cross sections of features which are approximately 1.7 mm, 2.2 mm, and 2.7 mm from the wafer edge, respectively, which have been processed using the setup employing the yttria coated HAA electrode ring.

As shown in the SEM images, the setup employing a yttria coated HAA electrode ring demonstrates significantly reduced feature profile tilting as compared to the standard setup.

Figure 15:
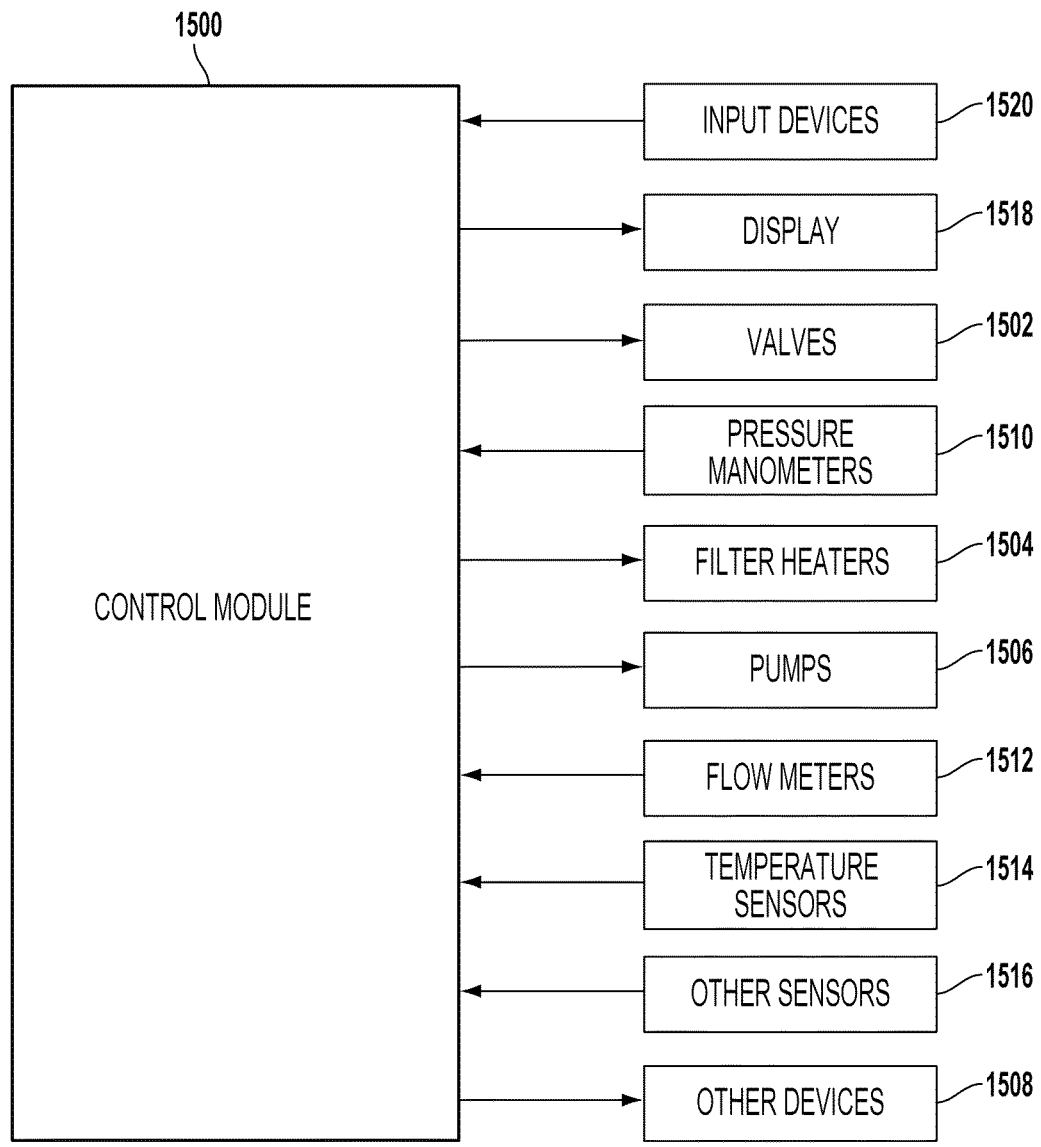
FIG. 15 shows a control module for controlling the systems of the present disclosure.

FIG. 15 shows a control module 1500 for controlling the systems described above. For instance, the control module 1500 may include a processor, memory and one or more interfaces. The control module 1500 may be employed to control devices in the system based in part on sensed values. For example only, the control module 1500 may control one or more of valves 1502, filter heaters 1504, pumps 1506, and other devices 1508 based on the sensed values and other control parameters. The control module 1500 receives the sensed values from, for example only, pressure manometers 1510, flow meters 1512, temperature sensors 1514, and/or other sensors 1516. The control module 1500 may also be employed to control process conditions during precursor delivery and plasma processing. The control module 1500 will typically include one or more memory devices and one or more processors.

The control module 1500 may control activities of the precursor delivery system and plasma processing apparatus. The control module 1500 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 1500 may also monitor the pressure differential and automatically switch vapor precursor delivery from one or more paths to one or more other paths. Other computer programs stored on memory devices associated with the control module 1500 may be employed in some embodiments.

Typically there will be a user interface associated with the control module 1500. The user interface may include a display 1518 (e.g. a display screen and/or graphical software displays of the apparatus and/or process conditions), and user input devices 1520 such as pointing devices, keyboards, touch screens, microphones, etc.

Computer programs for controlling delivery of precursor, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during processing include, but are not limited to, mass flow control modules, pressure sensors such as the pressure manometers 1510, and thermocouples located in delivery system, the pedestal or chuck (e.g. the temperature sensors 1514). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. An edge ring assembly for a plasma processing chamber, comprising:
    an upper edge ring configured to surround an electrostatic chuck (ESC) that is configured for electrical connection to an RF power supply, the ESC having a top surface for supporting a substrate and an annular step surrounding the top surface, the annular step defining an annular shelf that is lower than the top surface, the upper edge ring being disposed above the annular shelf, the upper edge ring being defined from an electrically insulating material;
    a lower inner edge ring disposed below the upper edge ring in the annular step and disposed on, and in contact with, the annular shelf, the lower inner edge ring having an electrically conductive structure defined from an electrically conductive material, the lower inner edge ring further having an anodization layer surrounding the electrically conductive structure so that the electrically conductive structure is electrically insulated from the ESC, the lower inner edge ring having a substantially rectangular cross-sectional shape, wherein a bottom surface of the lower inner edge ring directly contacts the annular shelf, and a side surface of the lower inner edge ring is adjacent to and surrounding a sidewall defined by the annular step;
    a lower outer edge ring surrounding the inner edge ring, the lower outer edge ring being disposed below the upper edge ring in the annular step and disposed over the annular shelf, the lower outer edge ring being defined from an electrically insulating material.

2. The edge ring assembly of claim 1, wherein a bottom portion of the anodization layer defines a dielectric separation between a bottom portion of the electrically conductive structure and the annular shelf that is configured to provide for a predefined capacitance, wherein power transferred to the ESC from the RF power supply is transferred through the annular shelf to the lower inner edge ring in a predefined relative amount as determined by the predefined capacitance.

3. The edge ring assembly of claim 1, wherein the upper edge ring is defined from a quartz material.

4. The edge ring assembly of claim 1, wherein the lower outer edge ring is defined from a quartz material.

5. The edge ring assembly of claim 1, wherein the electrically conductive structure is defined from an aluminum material.

6. The edge ring assembly of claim 1, wherein the anodization layer defines an anodized aluminum surface that provides for the electrical insulation from the ESC.

7. The edge ring assembly of claim 1, wherein the lower inner edge ring and the lower outer edge ring are disposed directly over the annular shelf of the ESC.

8. The edge ring assembly of claim 1, wherein application of RF power from the RF power supply to the ESC during plasma processing provides for a capacitive coupling of the lower inner edge ring to the ESC.

9. The edge ring assembly of claim 1, wherein the capacitive coupling during plasma processing causes a plasma sheath that is defined during the plasma processing to be radially extended in a spatial region that is defined substantially over the upper edge ring.

10. The edge ring assembly of claim 9, wherein the capacitive coupling during plasma processing reduces ion focusing at an edge region of the substrate.

11. The edge ring assembly of claim 10, wherein the capacitive coupling during plasma processing reduces tilting of ion trajectories at the edge region of the substrate away from normal to a top surface of the substrate.

12. The edge ring assembly of claim 1, wherein the upper edge ring is annularly shaped, having a radial thickness of about 15 to 24 mm, and a height of about 2 mm to 5 mm.

13. The edge ring assembly of claim 1, wherein the lower inner edge ring is annularly shaped, having a radial thickness of about 15 to 20 mm, and a height of about 8 to 15 mm.

14. The edge ring assembly of claim 13, wherein an inner diameter of the lower inner edge ring is about 0.5 to 1 mm greater than a diameter of the sidewall defined by the annular step of the ESC, so as to define an annular gap between the sidewall and the lower inner edge ring.

15. The edge ring assembly of claim 1, wherein the lower outer edge ring is annularly shaped, having a radial thickness of about 10 to 15 mm, and a height of about 8 mm to 15 mm.

16. The edge ring assembly of claim 1, wherein the upper edge ring has a top surface, the top surface of the upper edge ring having a stepped edge defined at an inner diameter of the upper edge ring, wherein a lower portion of the stepped edge is configured to sit at a lower height than the top surface of the ESC, such that the substrate when present extends over the lower portion of the stepped edge.

17. The edge ring assembly of claim 1, wherein the lower inner edge ring includes a yttria outer coating.

18. A system for plasma processing, comprising:
    a process chamber;
    an electrostatic chuck (ESC) disposed in the process chamber, the ESC having a top surface that is configured to support a substrate during plasma processing, the ESC further including an annular step surrounding the top surface, the annular step defining an annular shelf at a lower height than the top surface;
    an upper edge ring disposed above the annular shelf, the upper edge ring being defined from an electrically insulating material;
    a lower inner edge ring disposed below the upper edge ring in the annular step and disposed on, and in contact with, the annular shelf, the lower inner edge ring having an electrically conductive structure defined from an electrically conductive material, the lower inner edge ring further having an anodization layer surrounding the electrically conductive structure so that the electrically conductive structure is electrically insulated from the ESC, the lower inner edge ring having a substantially rectangular cross-sectional shape, wherein a bottom surface of the lower inner edge ring directly contacts the annular shelf, and a side surface of the lower inner edge ring is adjacent to and surrounding a sidewall defined by the annular step;
    a lower outer edge ring surrounding the inner edge ring, the lower outer edge ring disposed below the upper edge ring in the annular step and disposed over the annular shelf, the lower outer edge ring being defined from an electrically insulating material;

a bias electrode disposed within the ESC, the bias electrode configured to receive RF power from a first RF power supply to generate a bias voltage on the substrate.

\* \* \* \* \*